United States Patent
Hu et al.

(10) Patent No.: US 9,178,086 B2
(45) Date of Patent: Nov. 3, 2015

(54) METHOD FOR FABRICATING BACK-CONTACT TYPE SOLAR CELL

(71) Applicant: AU Optronics Corporation, Hsin-Chu (TW)

(72) Inventors: Yen-Cheng Hu, Hsin-Chu (TW);
Jen-Chieh Chen, Hsin-Chu (TW);
Zhen-Cheng Wu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 14/478,520

(22) Filed: Sep. 5, 2014

(65) Prior Publication Data
US 2015/0243806 A1      Aug. 27, 2015

(30) Foreign Application Priority Data
Feb. 27, 2014   (CN) .......................... 2014 1 0069201

(51) Int. Cl.
*H01L 31/18*      (2006.01)
*H01L 31/0216*    (2014.01)
*H01L 31/0236*    (2006.01)
*H01L 31/0224*    (2006.01)

(52) U.S. Cl.
CPC .... *H01L 31/02363* (2013.01); *H01L 31/02168* (2013.01); *H01L 31/022441* (2013.01); *H01L 31/186* (2013.01)

(58) Field of Classification Search
CPC ............ Y02E 10/547; H01L 31/02363; H01L 31/1804; H01L 31/068
USPC ....................... 438/72; 257/E31.119; 136/256
See application file for complete search history.

(56) References Cited

U.S. PATENT DOCUMENTS

| | | | |
|---|---|---|---|
| 7,999,175 B2 | 8/2011 | Nakayashiki et al. | |
| 2009/0227061 A1 | 9/2009 | Bateman et al. | |
| 2010/0267187 A1* | 10/2010 | Funakoshi | H01L 31/02363 438/72 |
| 2011/0201188 A1 | 8/2011 | Gupta et al. | |
| 2012/0273040 A1 | 11/2012 | Kim et al. | |
| 2015/0228812 A1* | 8/2015 | Tanaka | H01L 31/02167 136/256 |

FOREIGN PATENT DOCUMENTS

CN    102760791    10/2012
CN    102931255    2/2013

* cited by examiner

*Primary Examiner* — Evan Pert
*Assistant Examiner* — Changhyun Yi
(74) *Attorney, Agent, or Firm* — WPAT, PC; Justin King

(57) ABSTRACT

A method for fabricating back-contact type solar cells is provided. The method comprises forming a plurality of n-type doped zones, a plurality of p-type doped zones, and a back anti-reflection layer on a back surface of a semiconductor substrate. The lead-containing conductive paste may pass through the back anti-reflection layer and connect to the n-type doped zones and the p-type doped zones thereby being regarded as n-type electrodes and p-type electrodes.

32 Claims, 22 Drawing Sheets

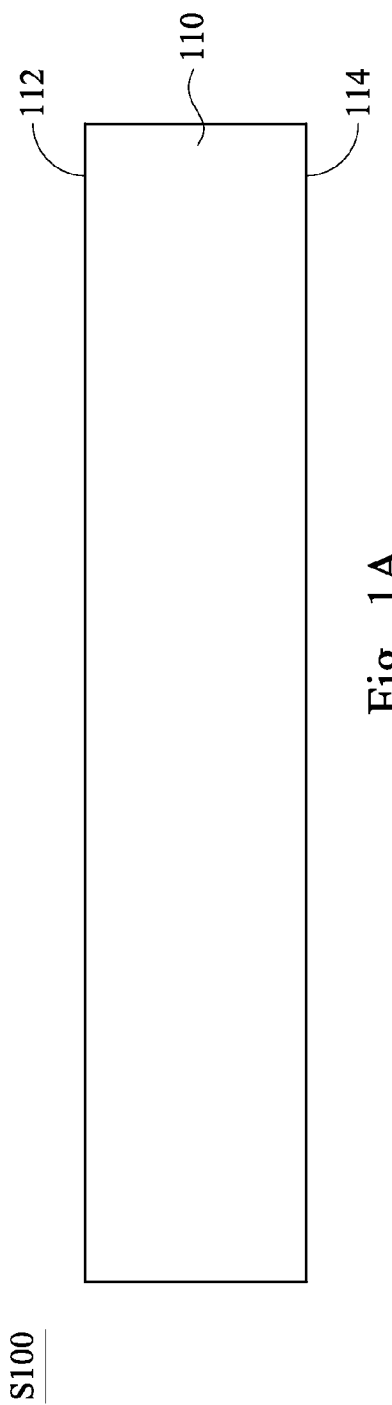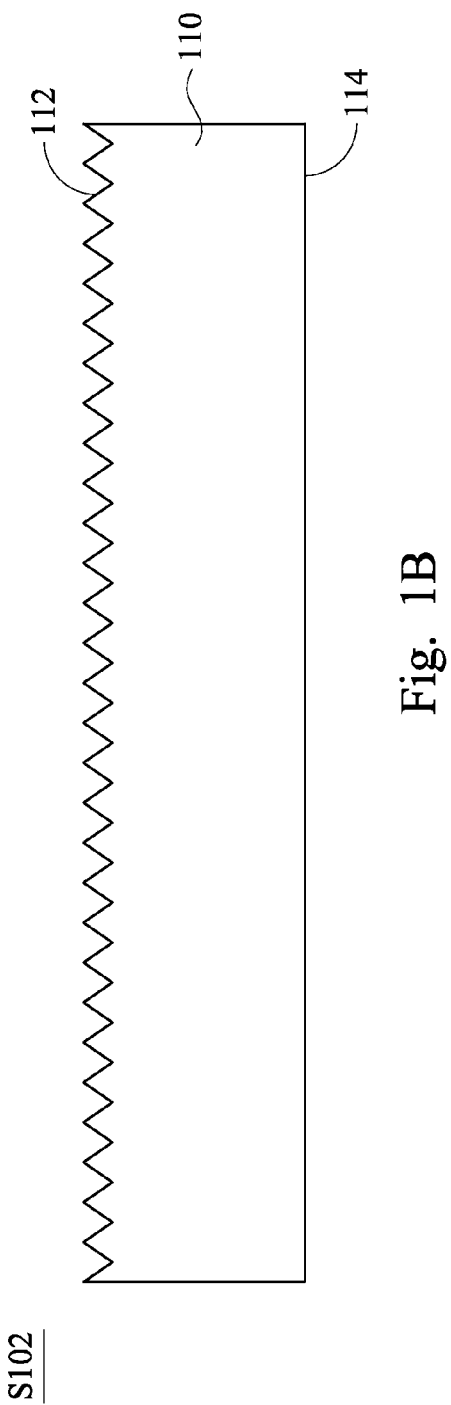

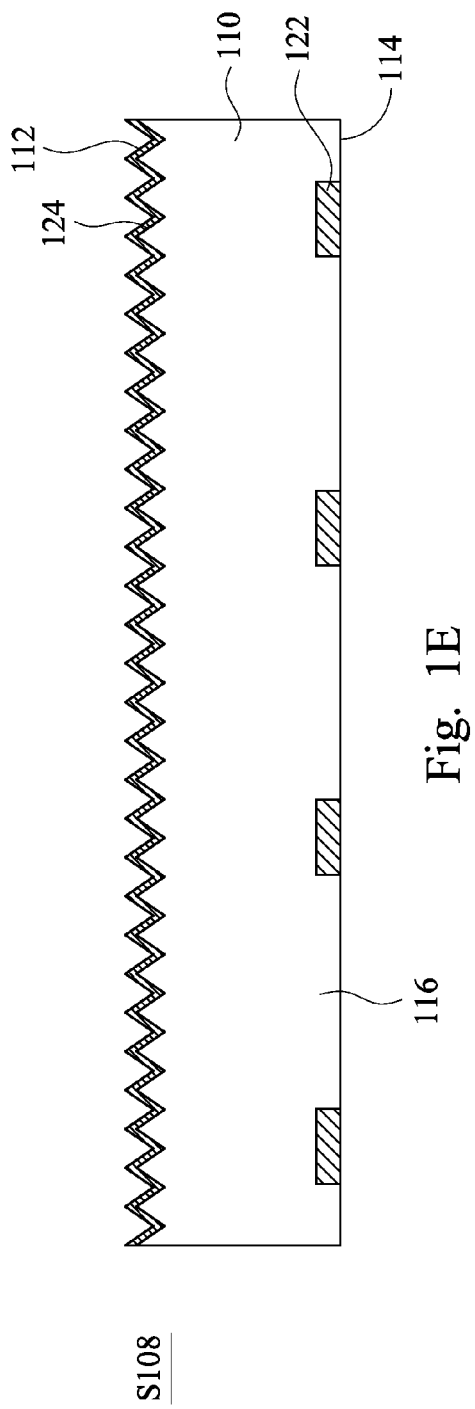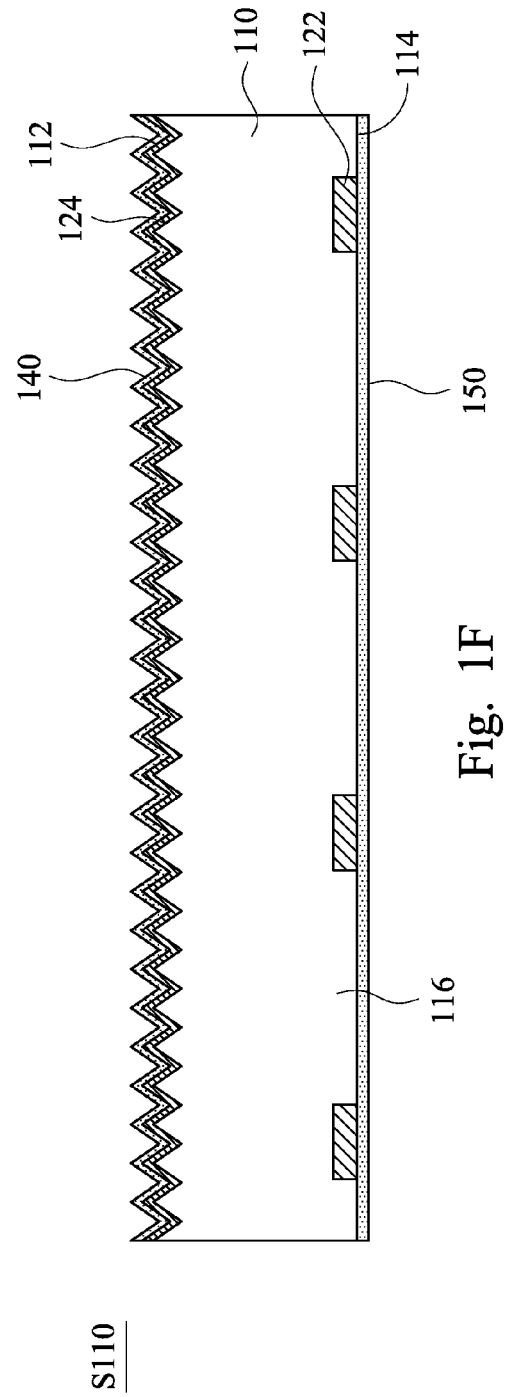

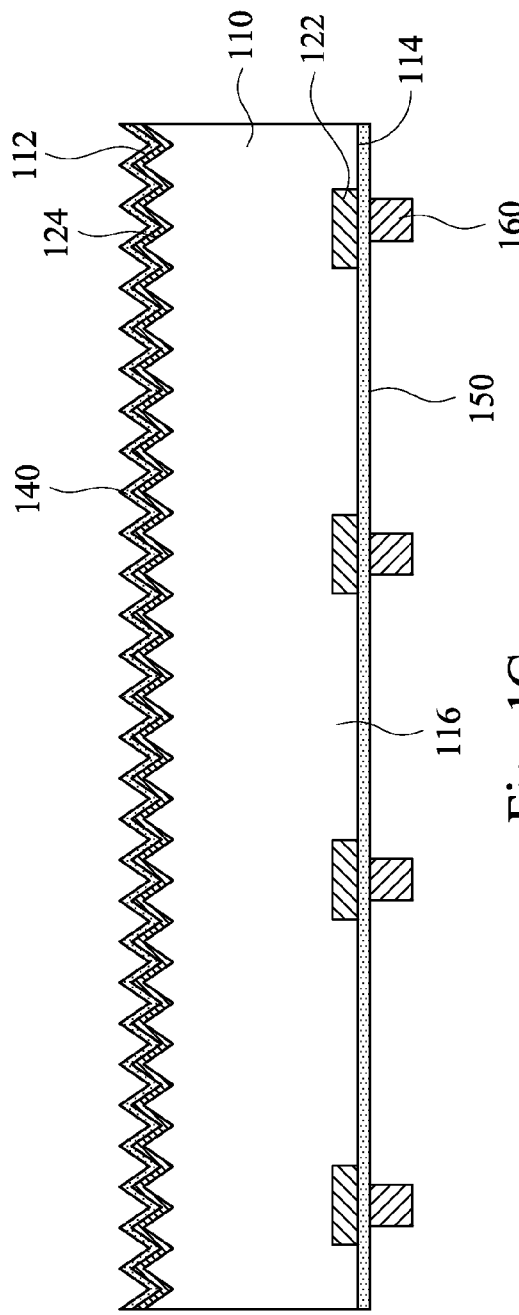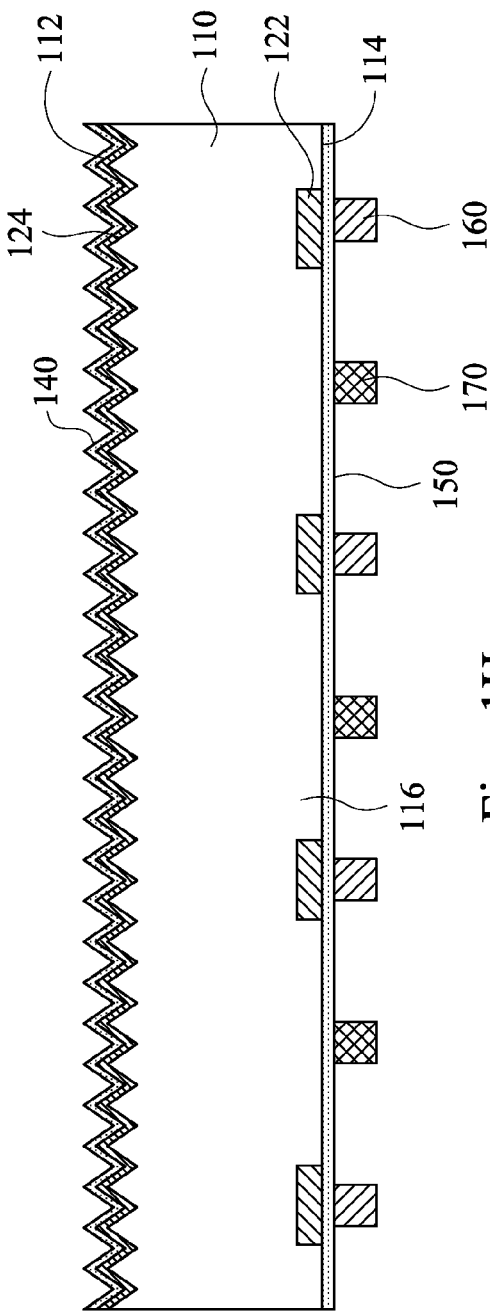

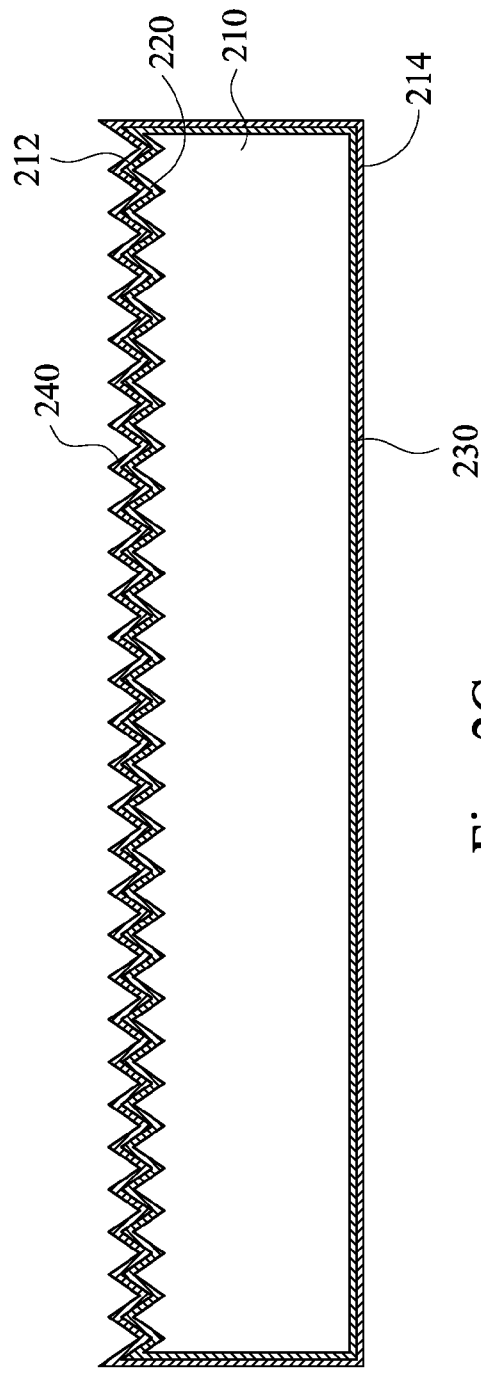
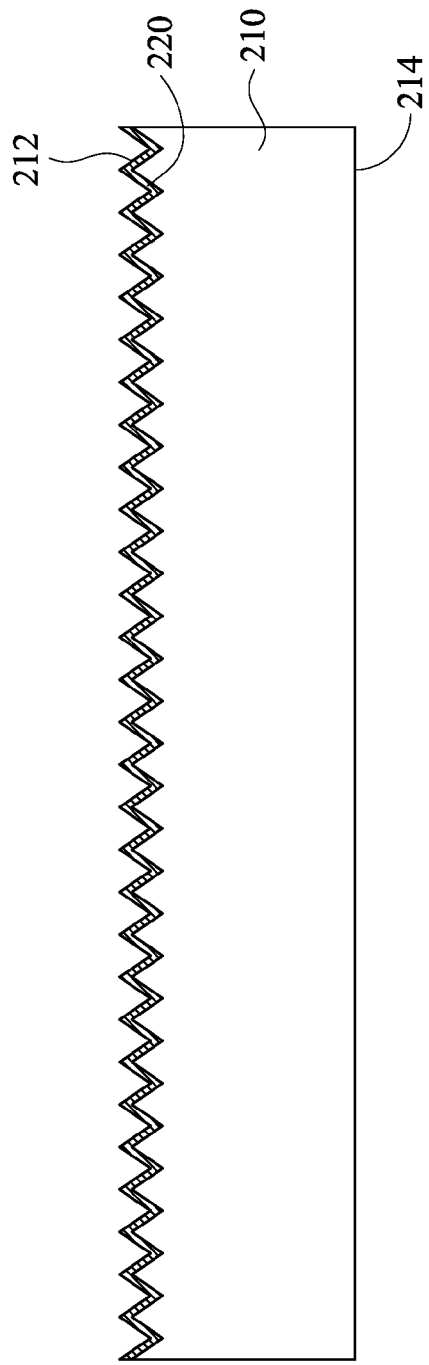
Fig. 2C
Fig. 2D

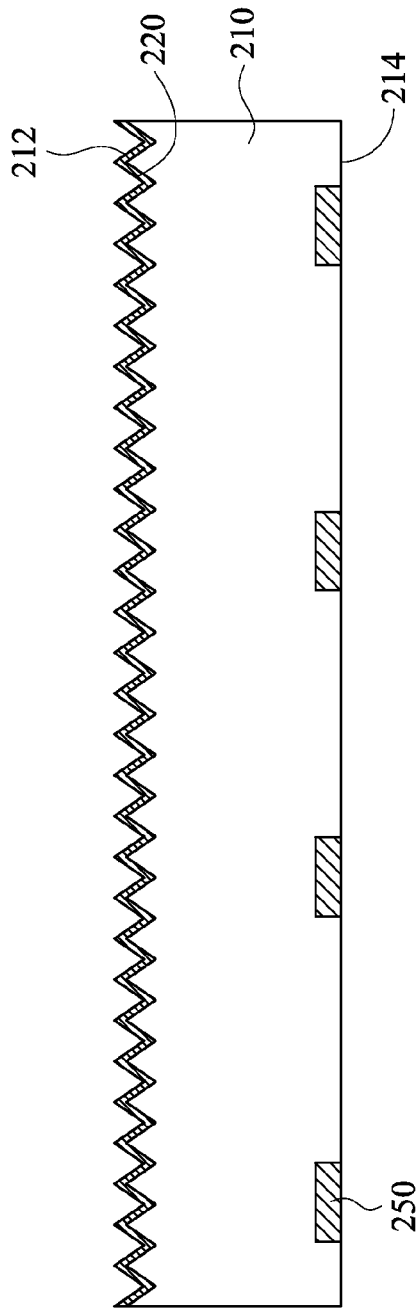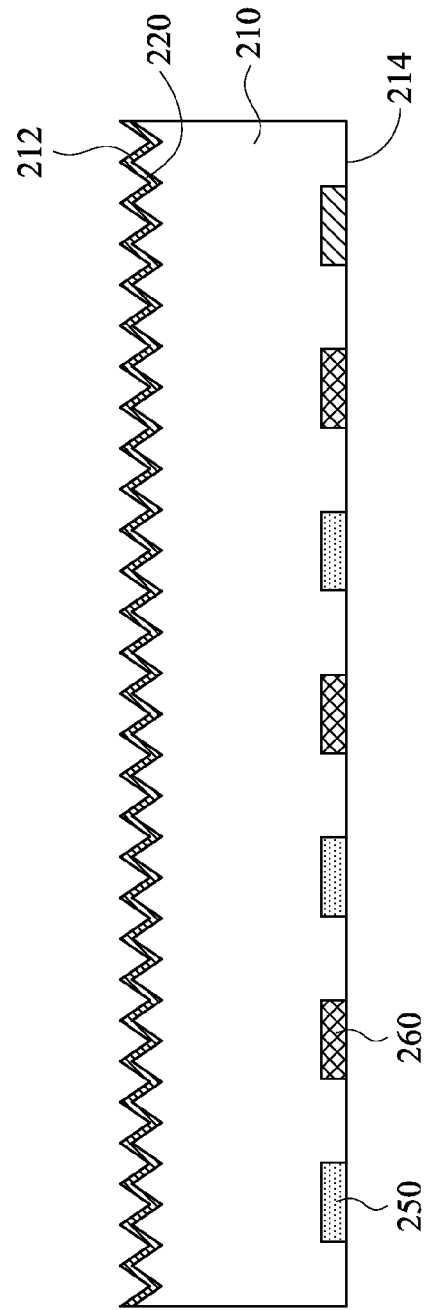

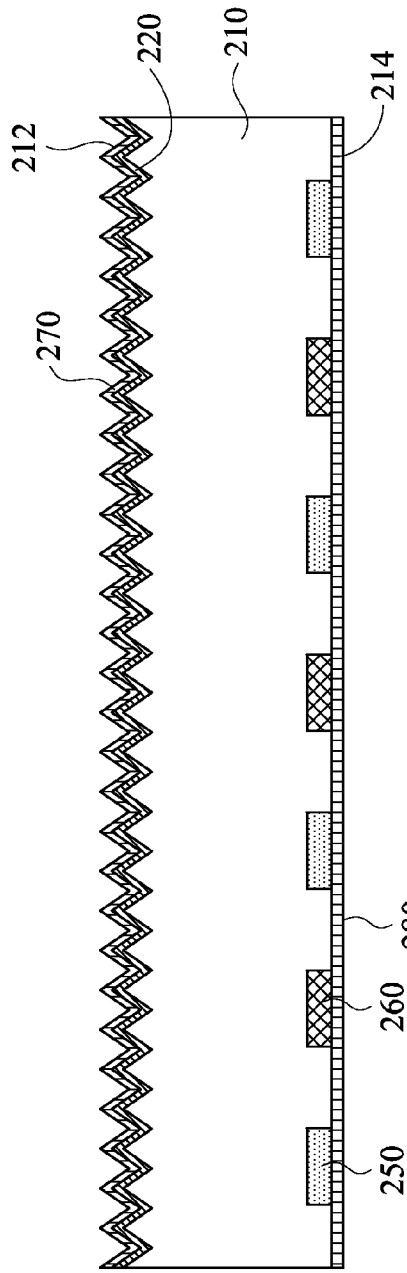
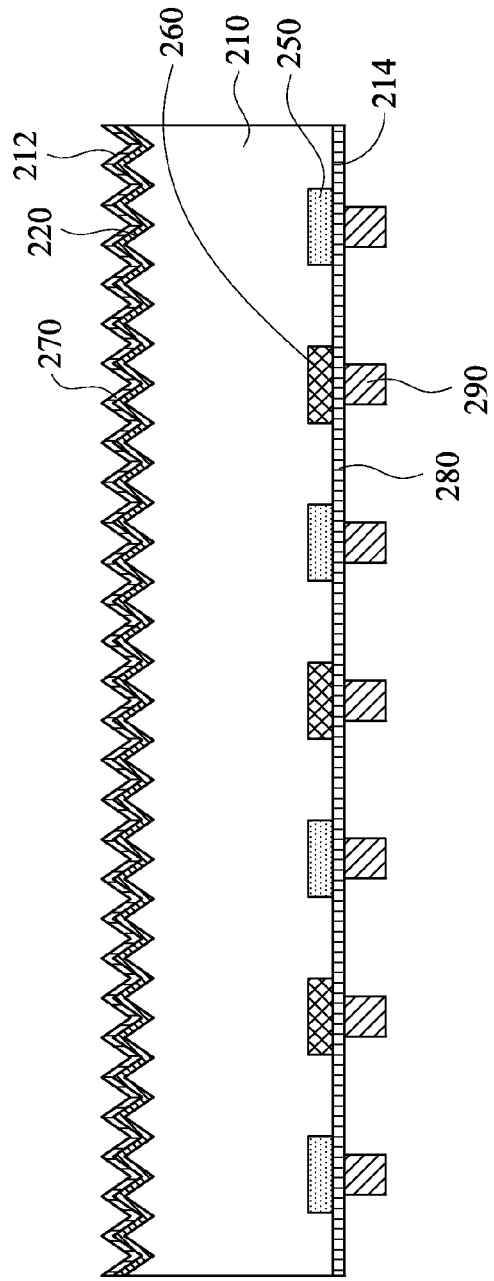

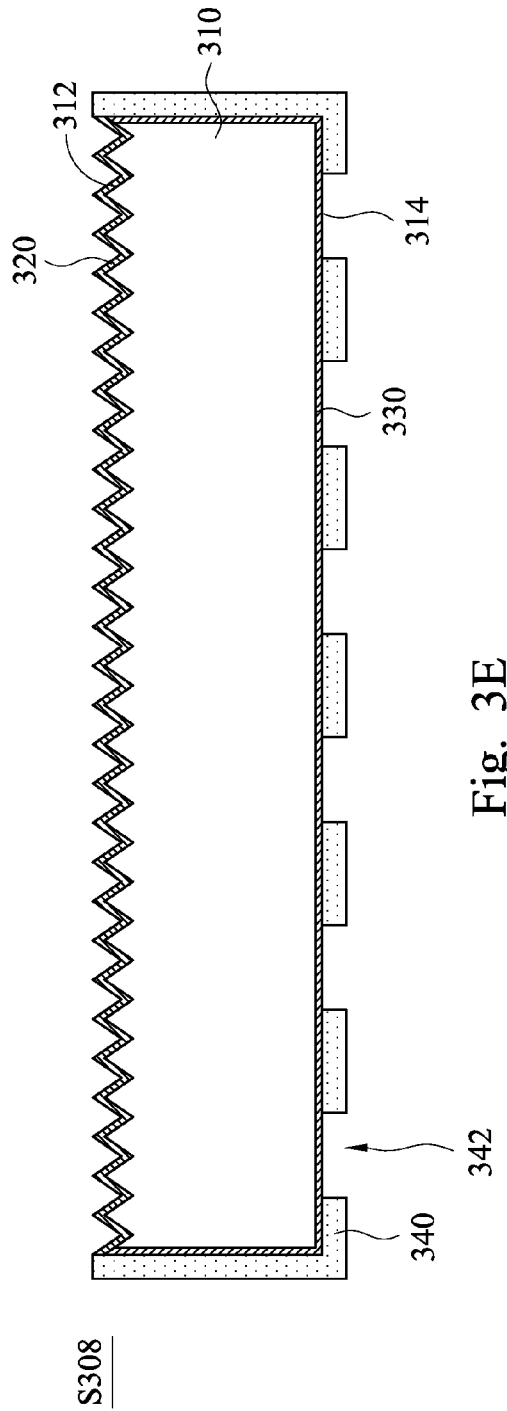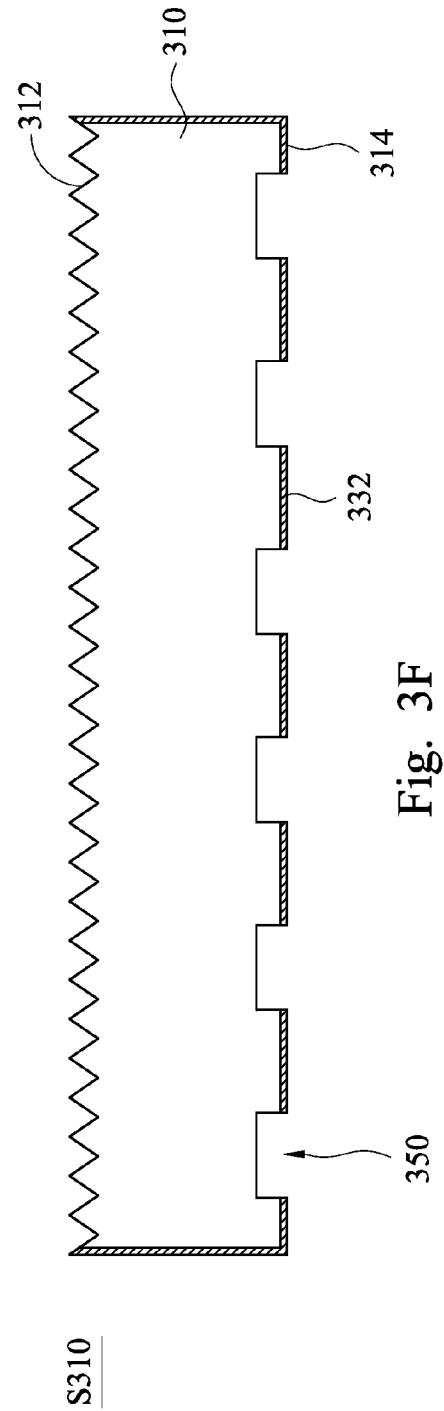

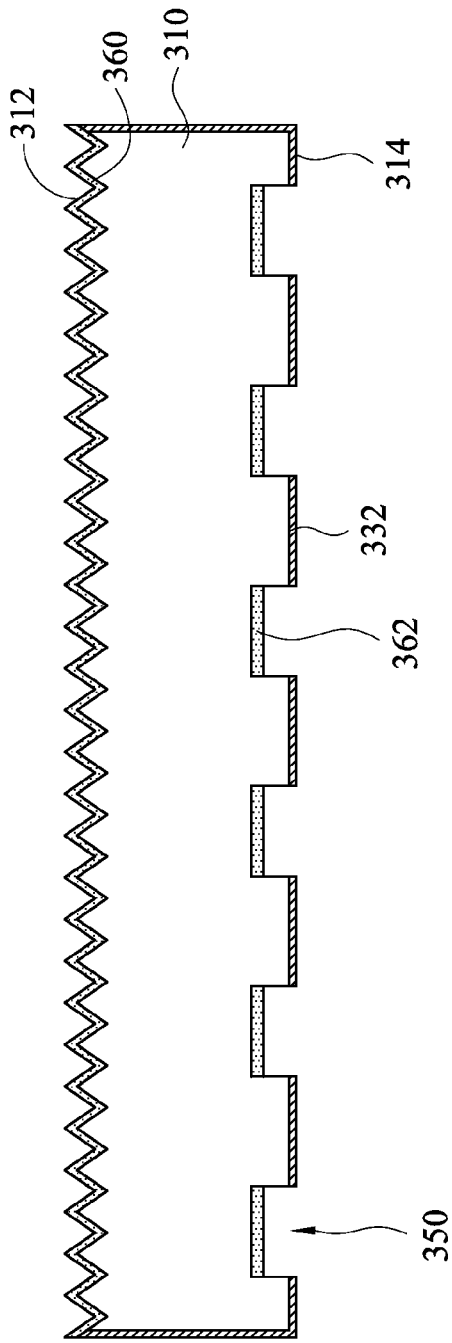
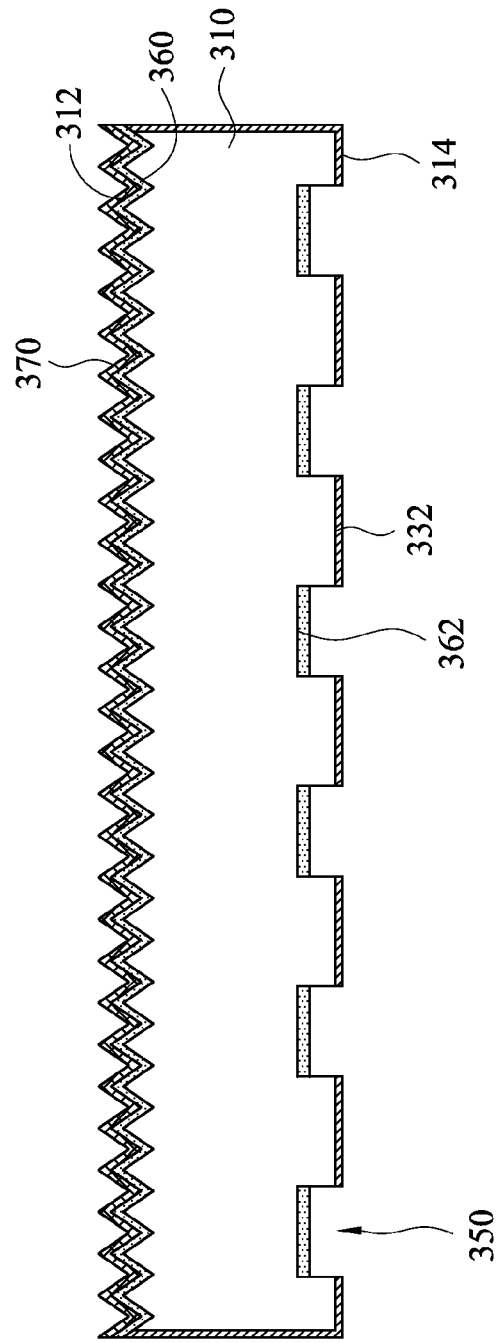
Fig. 3G
Fig. 3H

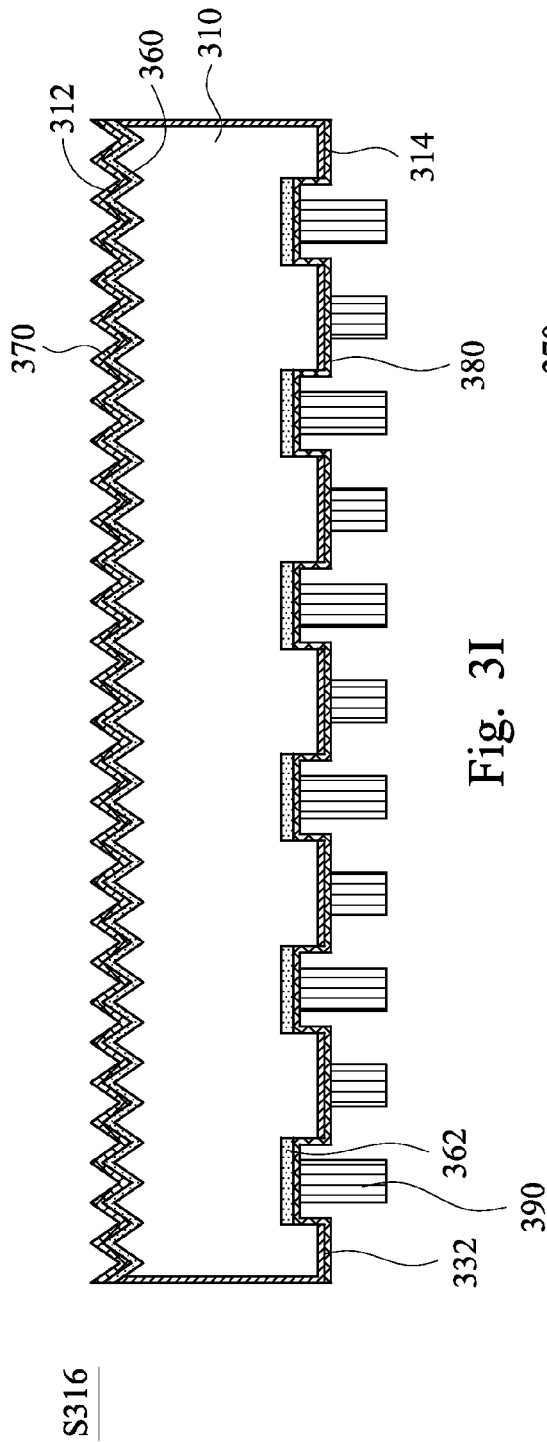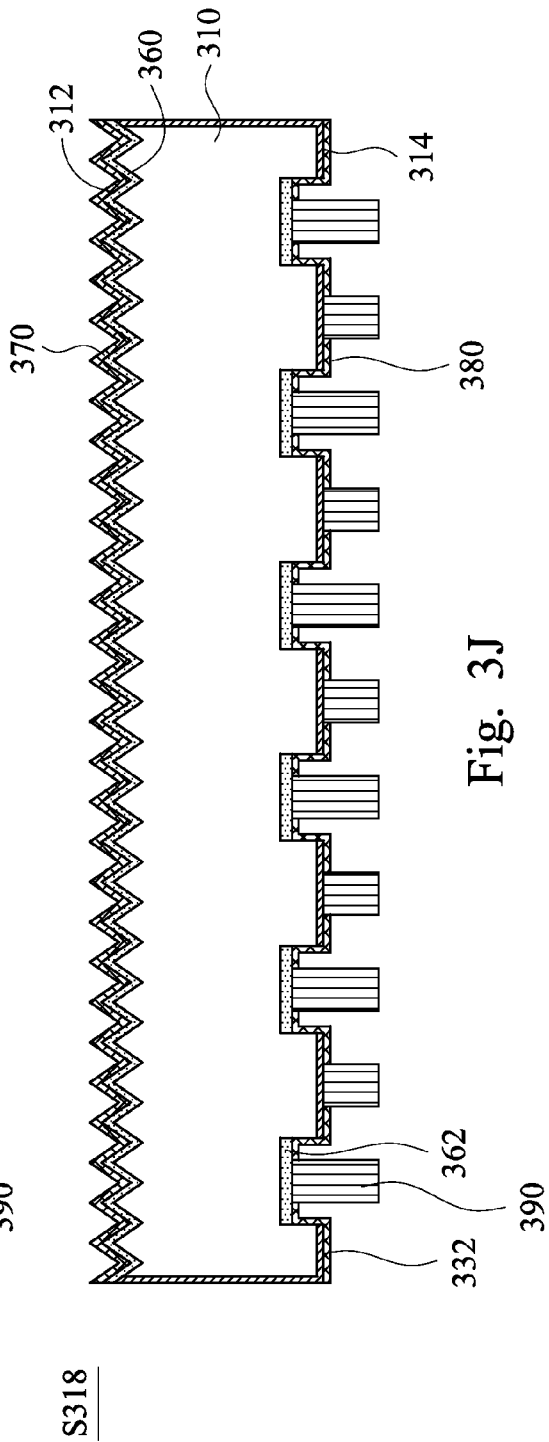

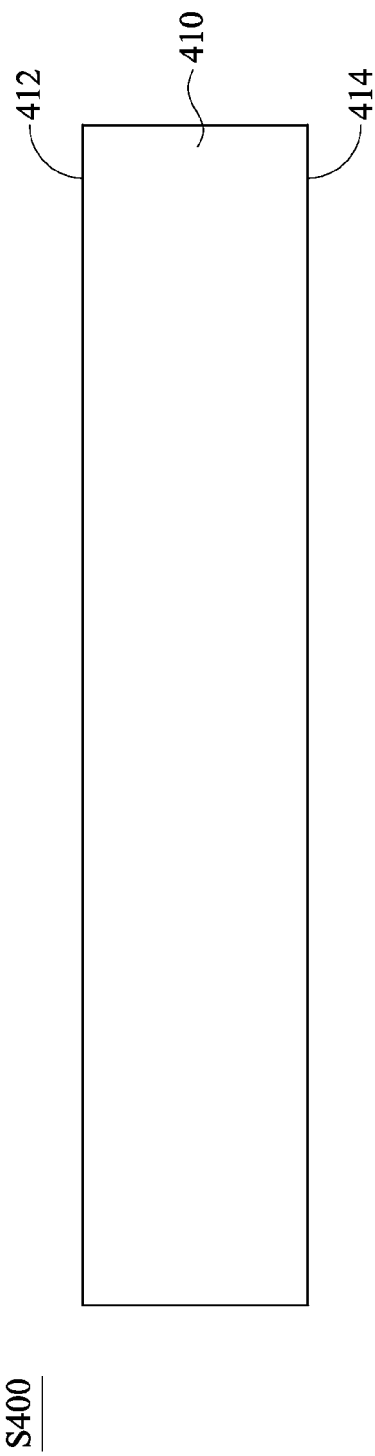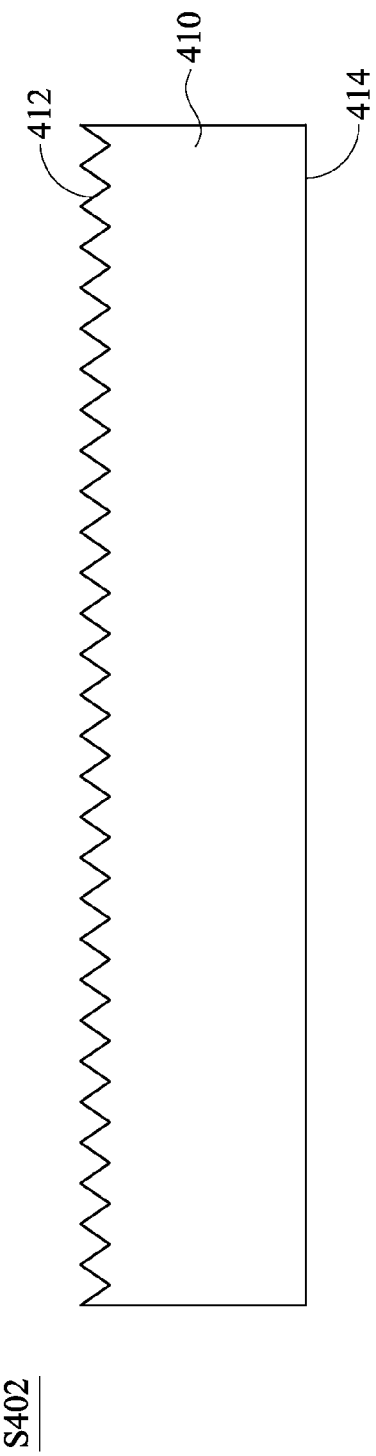
Fig. 4A
Fig. 4B

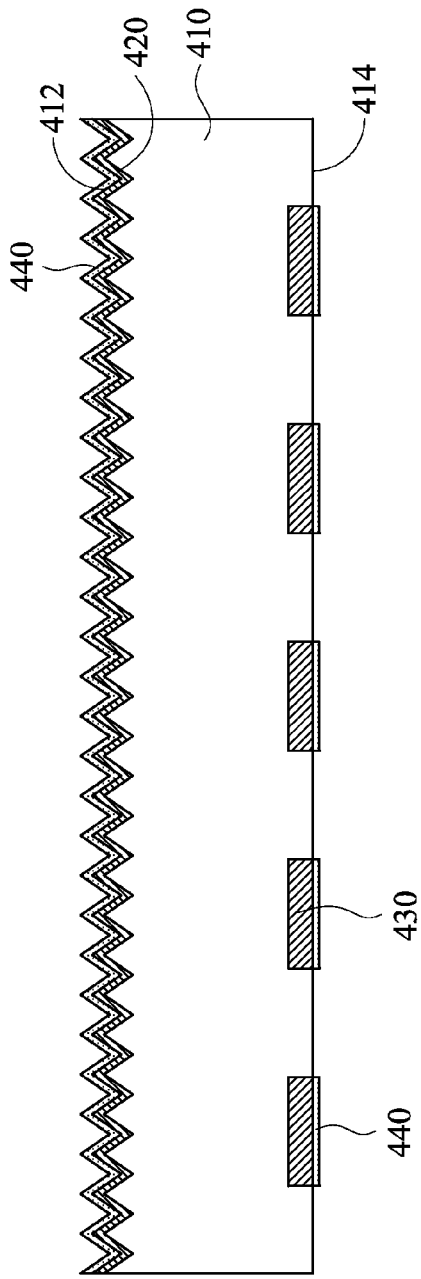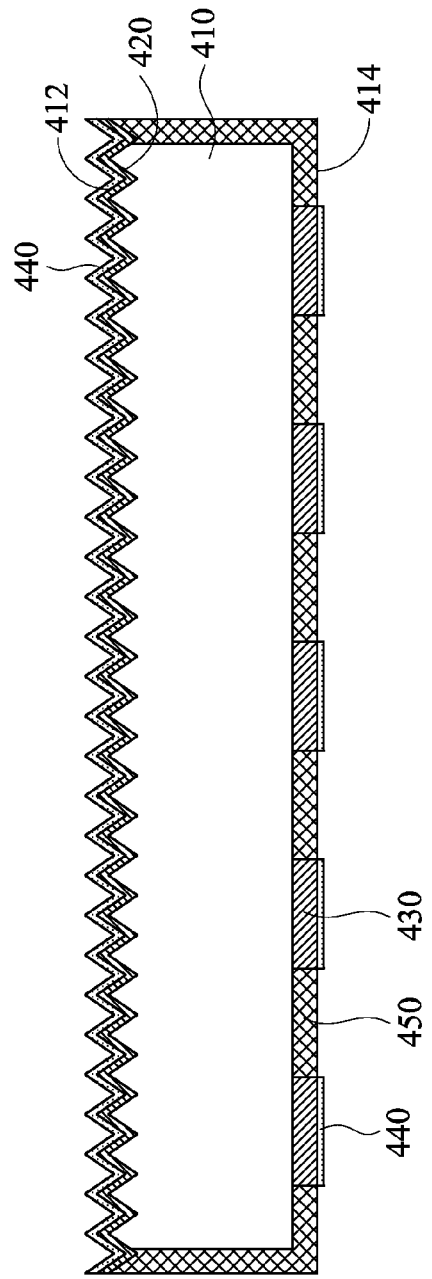

METHOD FOR FABRICATING BACK-CONTACT TYPE SOLAR CELL

RELATED APPLICATIONS

This application claims priority to China Application Serial Number 201410069201.7, filed Feb. 27, 2014, which is herein incorporated by reference.

BACKGROUND

1. Field of Invention

The present invention relates to a method for fabricating a solar cell. More particularly, the present invention relates to a method for fabricating a back-contact type solar cell.

2. Description of Related Art

Solar cells are devices that transform the ambient light energy into the electrical energy by the use of photovoltaic effect of specific materials. Photovoltaic effect is a phenomenon in which a conductive carrier is increased as light irradiates the inside of a designated material. For semiconductor materials, when light irradiates the inside of a designated material, the electrons inside the silicon atoms are stimulated by the light, which produces electron-hole pairs. The electron-hole pairs are affected by a built-in magnetic field, and these pairs are attracted by the n-typed semiconductor and p-typed semiconductor respectively, so the electron-hole pairs gather on the two sides of the semiconductor. At this time, a circuit can be formed by externally connecting the two sides with electrodes.

As light trapping efficiency continues to improve, back-contact type solar cells has gradually drawn attention. However, the fabrication process of back-contact type solar cells may have up to 22 steps. As a result, reducing the amount of steps of the fabrication process and the reducing fabrication cost of back-contact type solar cells has become an important issue.

SUMMARY

The invention provides a method for fabricating a back-contact type solar cell, and the method enhances the production efficiency by simplifying the fabrication process.

According to one embodiment of the present invention, a method for fabricating a back-contact type solar cell is provided. The method consists essentially of following steps: (a) providing a semiconductor substrate; (b) roughening a light receiving surface of the semiconductor substrate; (c) forming plural phosphorus-containing pastes on a back surface of the semiconductor substrate; (d) performing a phosphorus diffusion process on the semiconductor substrate, wherein the phosphorus-containing pastes enter the semiconductor substrate to form plural n-type heavily doped zones in the a back surface of the semiconductor substrate, and the phosphorus of the phosphorus diffusion process are diffused into the light-receiving surface of the semiconductor substrate to form a front surface field layer in the light receiving surface of the semiconductor substrate and to form a n-type lightly doped layer in the back surface and plural side surfaces of the semiconductor substrate; (e) removing the lightly doped n-type layer; (f) forming a front anti-reflection layer on the front surface field layer, and a back anti-reflection layer on the back surface; (g) printing plural lead-containing silver pastes on the back anti-reflection layer, wherein the lead-containing silver pastes are disposed corresponding to the n-type heavily doped zones, respectively; (h) printing plural lead-containing aluminum pastes on the back anti-reflection layer, wherein the lead-containing aluminum pastes are disposed corresponding to plural p-typed contacting regions of the back-contact type solar cell; and (i) sintering the lead-containing silver pastes and the lead-containing aluminum pastes for forming plural electrodes.

According to another embodiment of the present invention, a method for fabricating a back-contact type solar cell is provided. The method consists essentially of the following steps: (a) providing a semiconductor substrate; (b) roughening a light receiving surface of the semiconductor substrate; (c) performing a phosphorus diffusion process on the semiconductor substrate, wherein the phosphorus of the phosphorus diffusion process are diffused into the semiconductor substrate to form a front surface field layer in the light receiving surface of the semiconductor substrate, and a n-type doped layer in the back surface and plural side surfaces of the semiconductor substrate; (d) removing the n-type doped layer; (e) forming plural n-type doped zones in a back surface of the semiconductor substrate; (f) forming plural p-type doped zones in the back surface of the semiconductor substrate, wherein the n-type doped zones are spaced from the p-type doped zones; (g) forming a front anti-reflection layer on the front surface field layer, and a back anti-reflection layer on the back surface; (h) printing plural conductive pastes on the back anti-reflection layer, wherein the conductive pastes are disposed corresponding to the n-type doped zones and the p-type doped zones, respectively; and (i) sintering the conductive pastes for forming plural electrodes.

According to another embodiment of the present invention, a method for fabricating a back-contact type solar cell is provided. The method consists essentially of the following steps: (a) providing a semiconductor substrate; (b) roughening a light receiving surface of the semiconductor substrate; (c) forming a mask layer on the light receiving surface; (d) performing a boron ions diffusion process on the semiconductor substrate to form a p-type doped layer in the back surface and plural side surfaces of the semiconductor substrate; (e) removing the mask layer; (f) patterning the p-type doped layer to form plural grooves and plural p-type doped zones in the back surface, wherein the grooves and the p-type doped zones are alternately arranged; (g) forming a front surface field layer on the light receiving surface, and plural n-type doped zones in the grooves; (h) forming a front anti-reflection layer on the front surface field layer, and a back anti-reflection layer on the back surface; (i) printing plural conductive pastes on the back anti-reflection layer, wherein the conductive pastes are disposed corresponding to the n-type doped zones and the p-type doped zones, respectively; and (j) sintering the conductive pastes for forming plural electrodes.

According to another embodiment of the present invention, a method for fabricating a back-contact type solar cell is provided. The method consists essentially of the following steps: (a) providing a semiconductor substrate; (b) roughening a light receiving surface of the semiconductor substrate; (c) forming a front surface field layer in the light receiving surface; (d) forming plural n-type doped zones in the back surface of the semiconductor substrate; (e) forming a mask layer on the front surface field layer and covering the n-type doped zones; (f) performing a boron ions doping process on the semiconductor substrate to form plural p-type doped zones in the semiconductor substrate where the mask layer uncovers; (g) annealing the semiconductor substrate; (h) removing the mask layer; (i) forming a front anti-reflection layer on the front surface field layer, and a back anti-reflection layer on the back surface; (j) printing plural conductive pastes on the back anti-reflection layer, wherein the conductive pastes are disposed corresponding to the n-type doped zones and the p-type doped zones, respectively; (k) sintering the conductive pastes for forming plural electrodes; and (I) forming plural grooves on the back surface for isolating the n-type doped zones from the p-type doped zones.

The words "consists essentially of following steps," indicates that in addition to the following steps, some regular fabrication steps, such as moving or cleaning, are included in the method provided in the embodiments of the present invention.

A method for fabricating a back-contact type solar cell is provided. The production efficiency can be enhanced effectively by reducing the use of masks and fabrication steps.

BRIEF DESCRIPTION OF THE DRAWINGS

The invention can be more fully understood by reading the following detailed description of the embodiment, with references made to the accompanying drawings as follows.

FIG. 1A to FIG. 1I are different states of a method for fabricating a back-contact type solar cell according to one embodiment of this invention;

FIG. 2A to FIG. 2I are different states of a method for fabricating a back-contact type solar cell according to another embodiment of this invention;

FIG. 3A to FIG. 3J are different states of a method for fabricating a back-contact type solar cell according to another embodiment of this invention; and FIG. 4A to FIG. 4K are different states of a method for fabricating a back-contact type solar cell according to another embodiment of this invention.

DETAILED DESCRIPTION

Figure 1C:
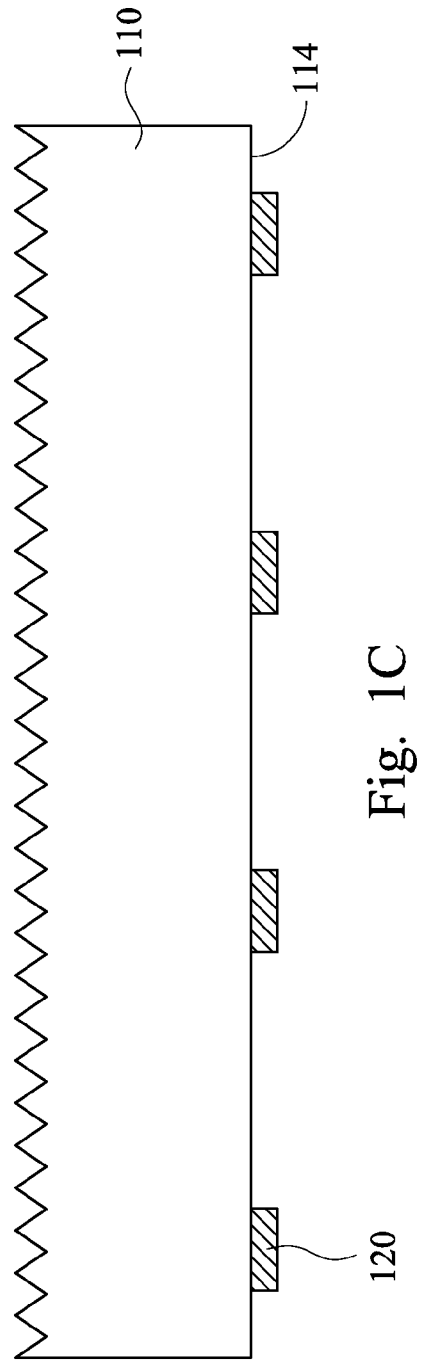

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1A to FIG. 1I, which are different states of a method for fabricating a back-contact type solar cell according to one embodiment of this invention. A method for fabricating a back-contact type solar cell is provided in this embodiment, and the method consists essentially of following steps. Herein the words "consists essentially of the following steps," indicates that in addition to the following steps, some regular fabrication steps, such as moving or cleaning, are included in the method provided in the embodiments of the present invention.

The step S100 of FIG. 1A is to provide a semiconductor substrate 110. The semiconductor substrate 110 can be a silicon substrate, such as a crystallized silicon or amorphous silicon substrate. In this embodiment the semiconductor substrate 110 is a p-type silicon substrate as example. The semiconductor substrate 110 has a light receiving surface 112 and a back surface 114 opposite to the light receiving surface 112. Generally, the light receiving surface 112 is the top surface of the semiconductor substrate 110 for receiving the sunlight, and the back surface 114 is the bottom surface (rear surface) of the semiconductor substrate 110.

The step S102 of FIG. 1B is to roughen the light receiving surface 112 of the semiconductor substrate (or wafer) 110. The step to roughen (or namely texturing) the light receiving surface 112 of the semiconductor substrate 110 can be performed by an anisotropic wet etching process, which forms microstructures on the light receiving layer 112. The microstructures may have various shapes and sizes, such as pyramid shapes or other polyhedron. Generally, the quality of the surface roughening process depends on the cleanness of the semiconductor substrate, the concentration and ratio of the etching liquid, the temperature of the etching liquid, and the reaction time. The purpose to roughen the light-receiving surface 112 of the semiconductor substrate 110 is to enhance the utilization of light, by preventing the smooth light receiving surface 112 from reflecting the light directly.

The step S104 of FIG. 1C is to form plural phosphorus-containing pastes 120 on the back surface 114 of the semiconductor substrate 110. Herein, the way to form the phosphorus-containing pastes 120 can be imprinting, inkjet coating, or other suitable methods. The phosphorus-containing pastes 120 are disposed corresponding to plural n-type predetermined contact regions of the back-contact type solar cell.

Figure 1D:
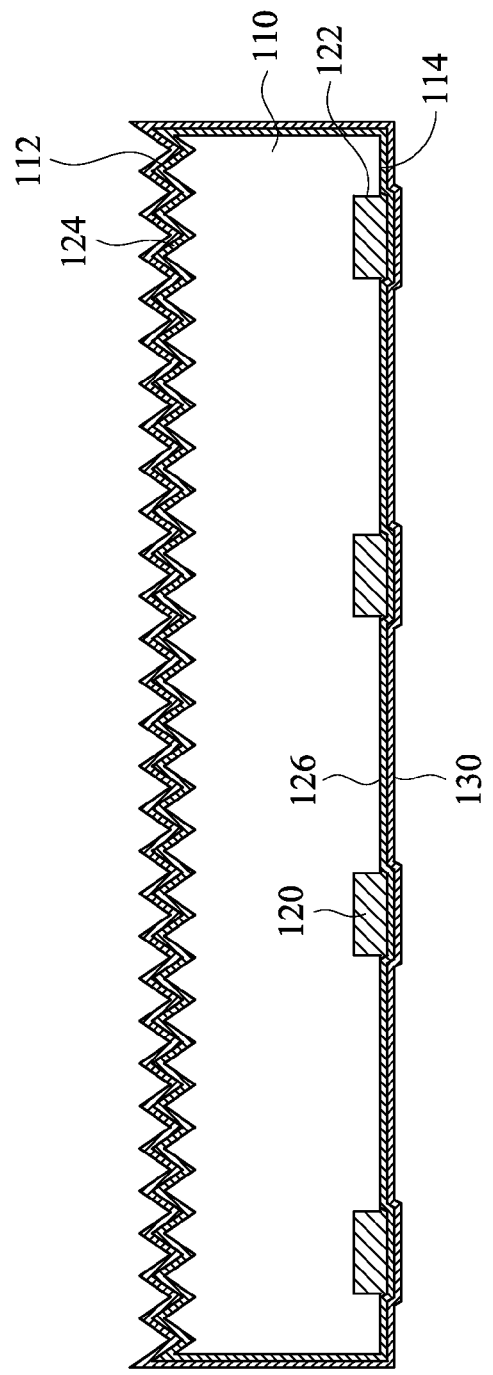

The step S106 of FIG. 1D is to perform a phosphorus diffusion process on the semiconductor substrate 110, including the usage of a phosphorus gas. For example, a gas mixture of $POCl_3$, oxygen, and nitrogen, diffuses in a high temperature diffusion furnace tube. After the diffusion of the phosphorus ions, the phosphorus-containing pastes 120 enter the semiconductor substrate 110, and form plural n-type heavily doped zones 122 in the back surface 114 of the semiconductor substrate 110. The phosphorus ions in the gas mixture diffuse to the light receiving surface 112 of the semiconductor substrate 110 and form a front surface field (FSF) layer 124. The phosphorus ions also diffuse to the side surfaces of the semiconductor substrate 110 and the back surface 114 is uncovered by the phosphorus-containing pastes 120, in which the back surface 114 is also exposed by n-type heavily doped zones (or namely n+ doped zones) 122, and forms a n-type lightly doped layer (or namely n− doped layer) 126. The doping concentration of the lightly doped layer is substantially lower than that of heavily doped zones. As shown in the cross-sectional view of FIG. 1C, a side surface of the semiconductor substrate 110 connects an edge of the light receiving surface 112 and an edge of the back surface 114 of the semiconductor substrate 110. Another side surface of the semiconductor substrate 110 connects another edge of the light receiving surface 112 and another edge of the back surface 114 of the semiconductor substrate 110.

The diffusion depth of the phosphorus diffusion process depends on the concentration of the phosphorus in the gas mixture, the flow rate of the gas mixture, the reaction time and the temperature of the furnace. At the phosphorus diffusion process, the silicon surface of the semiconductor has a reaction with the oxygen or water vapor in the gas mixture, especially thermal oxidation caused by heating. Hence, phosphosilicate glass (or namely phosphorous silicate glass, PSG) 130 is formed on the surface of the semiconductor substrate 110, which includes the surface of the front surface field layer 124 on the light receiving surface 112, the surface of the n-type lightly doped layer on the side surfaces, and the surface of the n-type lightly doped layer 126 and the n-type heavily doped layer on the back surface 114.

The step S108 of FIG. 1E is to remove the phosphosilicate glass 130 and the n-type lightly doped layer 126. To be specific, it is to remove the phosphosilicate glass 130 on the surface of the front surface field layer 124, to remove the phosphosilicate glass 130 and the n-type layer lightly doped 126 on the side surfaces of the semiconductor substrate 110, and to remove the phosphosilicate glass 130 and the lightly doped n-type layer 126 on the back surface 114 of the semiconductor substrate 110. The front surface field layer 124 in the light receiving surface 112 and the n-type heavily doped layer 122 in the back surface 114 of the semiconductor substrate 110 should still be held in place. To remove the phosphosilicate glass 130 and the n-type lightly doped layer 126 in FIG. 1D, the step S108 includes soaking the semiconductor substrate 110 in an acidic liquid, such as hydrogen fluoride liquid. Herein the level of the acidic liquid is higher than the light receiving surface 112 or high enough to immerse the light receiving surface 112 so that the phosphosilicate glass 130 (as shown in FIG. 1D) on the surfaces (light receiving surface 112 and the back surface 114) and side surfaces of the semiconductor substrate 110 can dissolve in the acidic liquid. Next, the back surface 114 and side surfaces of the semiconductor substrate 110 are etched to remove the n-type lightly doped layer 126 disposed thereon.

The step to remove the n-type lightly doped layer 126 includes soaking the semiconductor substrate 110 in an acidic liquid, such as hydrogen fluoride acid. The depth of the acidic liquid is not higher than the light-receiving surface 112 or not high enough to immerse the light-receiving surface 112. Only the side surfaces and back surface 114 of the semiconductor substrate 110 are to be soaked. Herein, the fabrication step to remove phosphosilicate glass 130 and the fabrication step to remove the n-type lightly doped layer 126 can be conducted respectively or integrated into one fabrication process. Also, the n-type lightly doped layer 126 can be removed from the side surfaces and back surface 114 of the semiconductor substrate 110 by a plasma etching process.

After removing the n-type lightly doped layer 126 from the side surfaces and the back surface 114 of the semiconductor substrate 110, portions of the p-type silicon substrate between the n-type heavily doped regions 122 are exposed on the back surface 114 of the semiconductor substrate 110. The exposed portions of the p-type silicon substrate are utilized as p-type contacting regions 116 of the back-contact type solar cell. Thus, the back surface 114 becomes the p-n border.

The step S110 of FIG. 1F is to form a front anti-reflection layer 140 on the front surface field layer 124 and to form a back anti-reflection layer 150 on the back surface 114, as shown in FIG. 1G.

The front anti-reflection layer 140 and the back anti-reflection layer 150 can be dielectric layers. In one embodiment, the front anti-reflection layer 140 and the back anti-reflection layer 150 can be formed simultaneously or respectively. Also, the forming step described above can be performed by plasma enhanced chemical vapor deposition (PECVD). Herein, the reaction gas can be a mixture of silane ($SiH_4$) and ammonia ($NH_3$) or a mixture of silane ($SiH_4$) and nitrogen ($N_2$), so that the front anti-reflection layer 140 with SiNx can be formed on the front surface field layer 124, and that the back anti-reflection layer 150 with SiNx can be formed on the back surface 114. In other embodiments, other dielectric layers with anti-reflection functions can also be adopted, such as SiON, SiOx or other suitable materials, for constructing a single layer or multi-layer structure.

In the PECVD fabrication process, the composition and the thickness of the anti-reflection layer depends on the frequency and power of radiofrequency (RF), the arrangement and pitches of the electrodes of the radiofrequency cavity, the reaction time, the temperature and the total pressure during the reaction, and the flow rate and composition of the reaction gas.

Subsequently, the step S112 of FIG. 1G is to form plural lead-containing silver pastes 160 on the back surface 114 of the semiconductor substrate 110. That is, the lead-containing silver pastes 160 are formed on the back anti-reflection layer 150. The lead-containing silver pastes 160 can be formed by imprinting, inkjet coating, or other suitable methods. The lead-containing silver pastes 160 are disposed corresponding to the heavily doped n-type zones 122 thereby being regarded as n-type electrodes.

The step S112 includes curing the lead-containing silver pastes 160 for positioning and shaping the lead-containing silver pastes 160 on the back surface 114 corresponding to the n-type heavily doped zones 122. The step to cure the lead-containing silver pastes 160 can be performed by heating the semiconductor substrate 110.

The step S114 of FIG. 1H is to form plural lead-containing aluminum pastes 170 on the back surface 114 of the semiconductor substrate 110. That is, the lead-containing aluminum pastes 160 are formed on the back anti-reflection layer 150. The lead-containing aluminum pastes 170 can be formed by imprinting, inkjet coating, or other suitable methods. The lead-containing aluminum pastes 170 are disposed corresponding to the p-type contacting regions 116 thereby being regarded as p-type electrodes.

The step S114 includes curing the lead-containing aluminum pastes 170 for positioning and shaping the lead-containing aluminum pastes 170 on the back surface 114 corresponding to the p-type contacting regions 116. The step to curing the lead-containing aluminum pastes 170 can be performed by heating the semiconductor substrate 110.

Figure 1I:
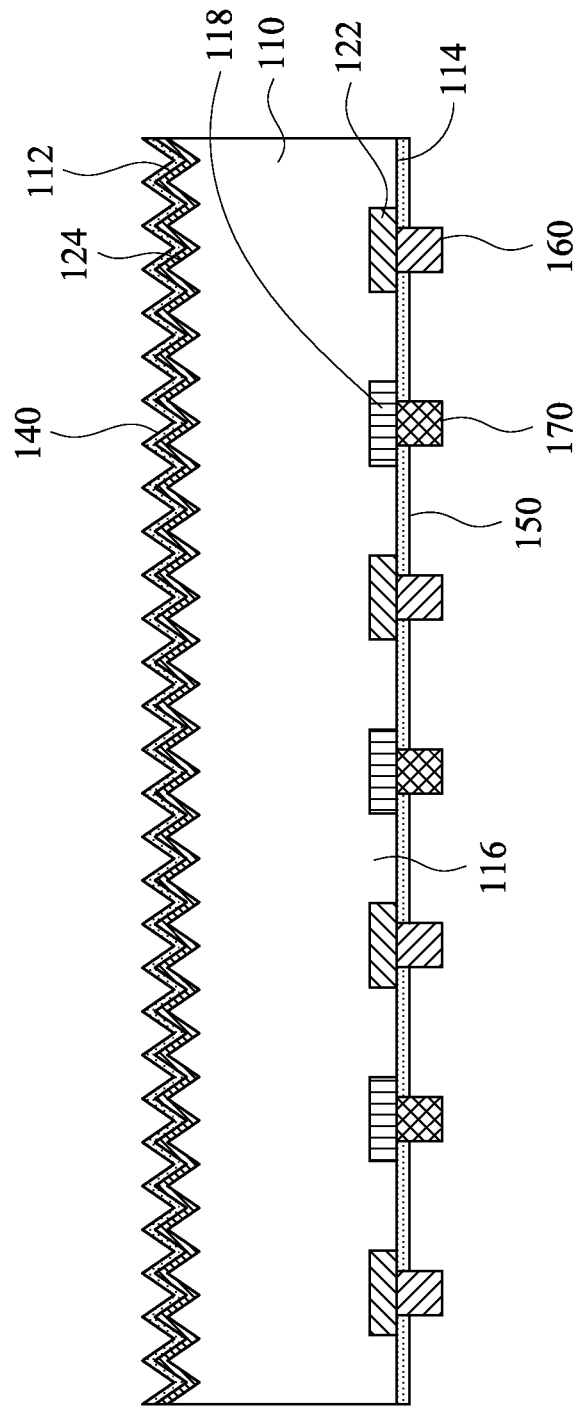

The step S116 of FIG. 1I is to sinter the lead-containing silver pastes 160 and the lead-containing aluminum pastes 170 to form plural electrodes on the back surface 114 of the semiconductor substrate 110. In the high temperature baking of the semiconductor substrate 110, the lead of the lead-containing silver pastes 160 and the lead-containing aluminum pastes 170 forms lead glass with the silicon of the back anti-reflection layer 150, in which the lead glass pass through the back anti-reflection layer 150. Therefore, the lead-containing silver pastes 160 connect to and contact the n-type heavily doped zones (or namely n+ doped zones) 122, and are thereby being regarded as n-type electrodes. The lead-containing aluminum pastes 170 connect to and contact p-type contacting regions 116 which are thereby being regarded as p-type electrodes. Also, in the high temperature baking of the semiconductor substrate 110, the aluminum of the lead-containing aluminum pastes 170 enters the semiconductor substrate 110, and form p-type heavily doped zones 118 (or namely p+ doped zones) of aluminum-silicon alloys with the silicon of the semiconductor substrate 110. In some embodiments of the present invention, the composition of the lead-containing aluminum pastes 170 includes silver. The doping concentration of the heavily doped zones is substantially higher than that of the semiconductor substrate.

After the above step, the lead-containing silver pastes 160 (n-type electrodes) and the lead-containing aluminum pastes 170 (p-type electrodes) can be formed and arranged alternatively on the back surface 114 of the semiconductor substrates 110. The lead-containing silver pastes 160 connect to and contact the n-type heavily doped zones 122, and the lead-containing aluminum pastes 170 connect to and contact the p-type heavily doped zones 118. The n-type heavily doped zones 122 are spaced and disconnected from the p-type heavily doped zones 118.

Reference is made to FIG. 2A to FIG. 2I, and FIG. 2A to FIG. 2I are different states of a method for fabricating a back-contact type solar cell according to another embodiment of this invention. A method for fabricating a back-contact type solar cell is provided in this embodiment, and the method consists essentially of following steps. Herein the words "consists essentially of following steps," indicates that in addition to the following steps, some regular fabrication steps, such as moving or cleaning, are included in the method provided in the embodiments of the present invention.

Figure 2A:
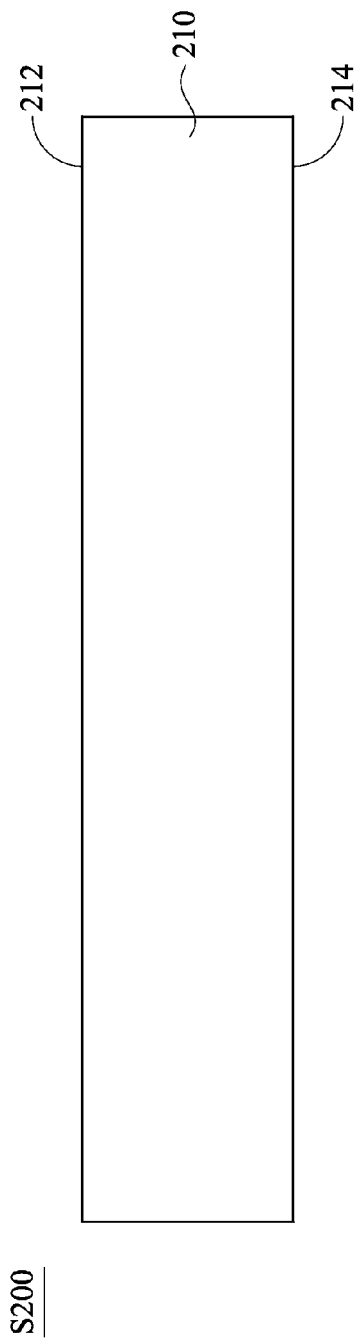

The step S200 of FIG. 2A is to provide a semiconductor substrate 210. The semiconductor substrate 210 can be a silicon substrate, such as a crystallized silicon or amorphous silicon substrate. In this embodiment the semiconductor substrate 210 is a p-type silicon substrate as example. The semiconductor substrate 210 has a light receiving surface 212 and a back surface 214 opposite to the light receiving surface 212. Generally, the light receiving surface 212 is the top surface (or namely front surface) of the semiconductor substrate 210 for receiving the sunlight, and the back surface (or namely rear surface) 214 is the bottom surface of the semiconductor substrate 210.

Figure 2B:
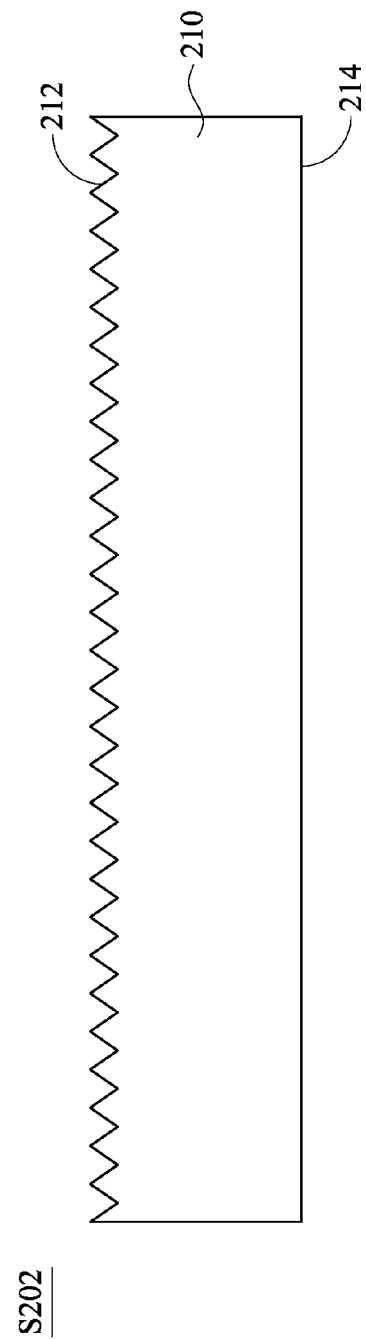

The step S202 of FIG. 2B is to roughen the light receiving surface 212 of the semiconductor substrate 210 (or wafer). The step S202 to roughen (or namely texturing) the light receiving surface 212 of the semiconductor substrate 210 can be performed by an anisotropic wet etching process, which forms microstructures on the light receiving layer 212. The microstructures may have various shapes and sizes, such as pyramidal shapes or other polyhedron. Generally, the quality of the surface roughening process depends on the cleanness of the semiconductor substrate, the concentration and ratio of the etching liquid, the temperature of the etching liquid, and the reaction time. The purpose to roughen the light receiving surface 212 of the semiconductor substrate 210 is to enhance the utilization of light by preventing the smooth light receiving surface 212 from reflecting the light directly.

The step S204 of FIG. 2C is to perform a phosphorus diffusion process on the semiconductor substrate 210 for forming a n-type front surface field (FSF) layer 220 on the light receiving surface 212 of the semiconductor substrate 210, and for forming the n-type lightly doped layer 230 on the side surfaces and the back surface 214 of the semiconductor substrate 210.

The step to perform a phosphorus diffusion process on the semiconductor substrate 210 includes the usage of phosphorus gas. For example, a gas mixture of $POCl_3$, oxygen, and nitrogen, diffuses in a high temperature diffusion furnace tube. The diffusion depth of the phosphorus diffusion process depends on the concentration of the phosphorus in the gas mixture, the flow rate of the gas mixture, the reaction time and the temperature of the furnace. During the phosphorus diffusion process, the silicon surface of the semiconductor has a reaction with the oxygen or water vapor in the gas mixture, especially thermal oxidation caused by heating. Hence, phosphosilicate glass (or namely phosphorous silicate glass, PSG) 240 are formed on the surface of the semiconductor substrate 210, which includes the surface of the front surface field layer 220 on the light receiving surface 212, the surface of the n-type lightly doped layer (or namely n– doped layer) 230 on the side surfaces, and the surface of the n-type lightly doped layer 230 on the back surface 214. As shown in the cross-sectional view of FIG. 2C, one side surface of the semiconductor substrate 210 connects an edge of the light receiving surface 212 and an edge of the back surface 214 of the semiconductor substrate 210. Another side surface of the semiconductor substrate 210 connects another edge of the light receiving surface 212 and another edge of the back surface 214 of the semiconductor substrate 210

The step S206 of FIG. 2D is to remove the phosphosilicate glass 240 and the lightly doped n-type layer 230. To be specific, it is to remove the phosphosilicate glass 240 on the surface of the front surface field layer 220, to remove the phosphosilicate glass 240 and the n-type lightly doped layer 230 on the side surfaces of the semiconductor substrate 210, and to remove the phosphosilicate glass 240 and the n-type lightly doped layer 230 on the back surface 214 of the semiconductor substrate 210. The front surface field layer 220 on the light receiving surface 212 of the semiconductor substrate 210 is still held in place. The step S206 to remove the n-type lightly doped layer 230 includes soaking the semiconductor substrate 210 in an acidic liquid, such as a hydrogen fluoride liquid. Herein the level of the acidic liquid is higher than the light-receiving surface 212 or high enough to immerse the light-receiving surface 212 so that the phosphosilicate glass 240 (as shown in FIG. 2C) on the surfaces (light receiving surface 212 and the back surface 214) and the side surfaces of the semiconductor substrate 110 can dissolve in the acidic liquid. Next, the back surface 214 and side surfaces of the semiconductor substrate 210 are etched to remove the n-type lightly doped layer 230 disposed thereon.

The step to remove the n-type lightly doped layer 230 includes soaking the semiconductor substrate 210 in an acidic liquid, such as a hydrogen fluoride liquid. The depth of the acidic liquid is not higher than the light-receiving surface 212 or not high enough to immerse the light-receiving surface 212. Only the side surfaces and back surface 214 of the semiconductor substrate 210 are soaked. Herein, the fabrication step to remove the phosphosilicate glass 240 and the fabrication step to remove the n-type lightly doped layer 230 can be conducted respectively or integrated in one fabrication process. Also, the n-type lightly doped layer 230 can be removed from the side surfaces and back surface 114 of the semiconductor substrate 110 by a plasma etching process.

The step S208 of FIG. 2E is to form plural n-type doped zones 250 in the back surface 214 of the semiconductor substrate 210. The step to form n-type doped zones 250 can be performed through ion implantation or coating phosphorous pastes on the surface of the substrate for finely controlling the depths, shapes, and locations of the doped zones. If ion implantation is taken as an example, this step includes the high-energy implantation of an agent containing phosphorous ions, such as $PH_3$, into the predetermined doped zones to form the n-type heavily doped zones (or namely n+ doped zones) 250. After ion implantation, the original structure of the silicon crystal near the surface may be crushed and/or damaged by the high-energy ions, so step S208 further includes an annealing process to restore the original structure of the silicon crystal and to activate the dopants.

The step S210 of FIG. 2F is to form plural p-type doped zones 260 on the back surface 214 of the semiconductor substrate 210. Similarly, the step to form p-type doped zones 260 can be performed through ion implantation or coating phosphorous pastes on the surface of the substrate for finely controlling the depths, shapes, and locations of the doped zones. If ion implantation is again taken as an example, this step includes high-energy implantation of an agent containing boron ions, such as $BF_3$, into the predetermined doped zones to form the p-type heavily doped zones (or namely p+ doped zones) 260.

Therefore, the n-type doped zones 250 are spaced and disconnected from the p-type doped zones 260. Likewise, an annealing process can be performed after the ion implantation to restore the original structure of the silicon crystal and activate the dopants.

The step S212 of FIG. 2G is to form a front anti-reflection layer 270 on the front surface field layer 220, and to form a back anti-reflection layer 280 on the back surface 214.

The front anti-reflection layer 270 and the back anti-reflection layer 280 can be dielectric layers. In one embodiment, the front anti-reflection layer 270 and the back anti-reflection layer 280 can be formed simultaneously or respectively. The above formation step can be performed by plasma enhanced chemical vapor deposition, PECVD. Herein, the reaction gas can be a mixture of silane ($SiH_4$) and ammonia ($NH_3$) or a mixture of silane ($SiH_4$) and nitrogen ($N_2$), so that the front anti-reflection layer 270 with SiNx can be formed on the front surface field layer 220, and that the back anti-reflection layer 280 with SiNx can be formed on the back surface 214. In other embodiments, other dielectric layer with anti-reflection functions can also be adopted, such as SiON, SiOx or other suitable materials, for constructing a single layer or multi-layer structure.

In the fabrication process of PECVD, the composition and the thickness of the anti-reflection layer depends on the frequency and power of the radio frequency signal (RF), the arrangement and pitch of the electrodes of radiofrequency cavity, the reaction time, the temperature and the total pressure during the reaction, and the flow rate and composition of the reaction gas.

The step S214 of FIG. 2H is to form plural conductive pastes 290 on the back surface 214 of the semiconductor substrate 210. That is, the conductive pastes 290 are formed on the back anti-reflection layer 280. The conductive pastes 290 are formed by imprinting, inkjet coating, or other suitable methods. The conductive pastes 290 are disposed corresponding to the n-type heavily doped zones 250 and the p-type heavily doped zones 260 thereby being regarded as n-type electrodes and p-type electrodes. The conductive pastes 290 can be lead-containing silver pastes, aluminum pastes, or silver aluminum pastes.

The step S214 includes curing the conductive pastes 290 for positioning and shaping the conductive pastes 290 on the back surface 214 corresponding to the n-type heavily doped zones 250 and the p-type heavily doped zones 260. The step to cure the conductive pastes 290 can be performed by heating the semiconductor substrate 210.

Figure 2I:
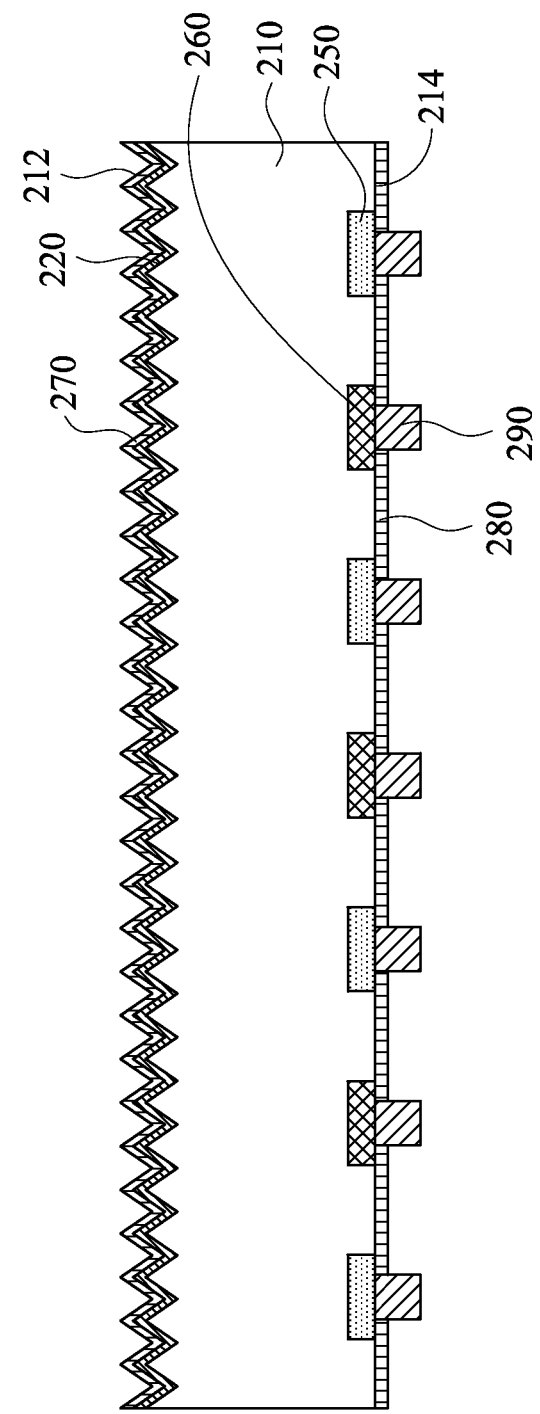

The step S216 of FIG. 2I is to sinter the conductive pastes 290 to form plural electrodes on the back surface 214 of the semiconductor substrate 210. In the high temperature baking of the semiconductor substrate 210, the conductive material of the conductive pastes 290, such as lead, forms lead glass with the silicon of the back anti-reflection layer 280, in which the lead glass pass through the back anti-reflection layer 280. Therefore, a portion of the conductive pastes 290 connects to and contact the n-type heavily doped zones 250 thereby being regarded as n-type electrodes; another portion of the conductive pastes 290 connects to and contact the p-type heavily doped zones 260 thereby being regarded as p-type electrodes. Also, in the high temperature baking of the semiconductor substrate 210, the conductive material of the conductive pastes 290, such as lead, enters the semiconductor substrate 210 and form p-type heavily doped zones 260 of lead-silicon alloys with the silicon of the semiconductor substrate 210. The conductive pastes 290 connect to and contact the p-type heavily doped zones 260. The doping concentration of the p-type heavily doped zones is substantially higher than that of the semiconductor substrate.

After the above step, the n-type electrodes and p-type electrodes can be formed and arranged alternatively on the back surface 214 of the semiconductor substrates 210. The n-type heavily doped zones 250 are spaced and disconnected from the p-type heavily doped zones 260.

Reference is made to FIG. 3A to FIG. 3J, and FIG. 3A to FIG. 3J are different states of a method for fabricating a back-contact type solar cell according to another embodiment of this invention. A method for fabricating a back-contact type solar cell is provided in this embodiment, and the method consists essentially of following steps. Herein the words "consists essentially of following steps," indicates that in addition to the following steps, some regular fabrication steps, such as moving or cleaning, are included in the method provided in the embodiments of the present invention.

Figure 3A:
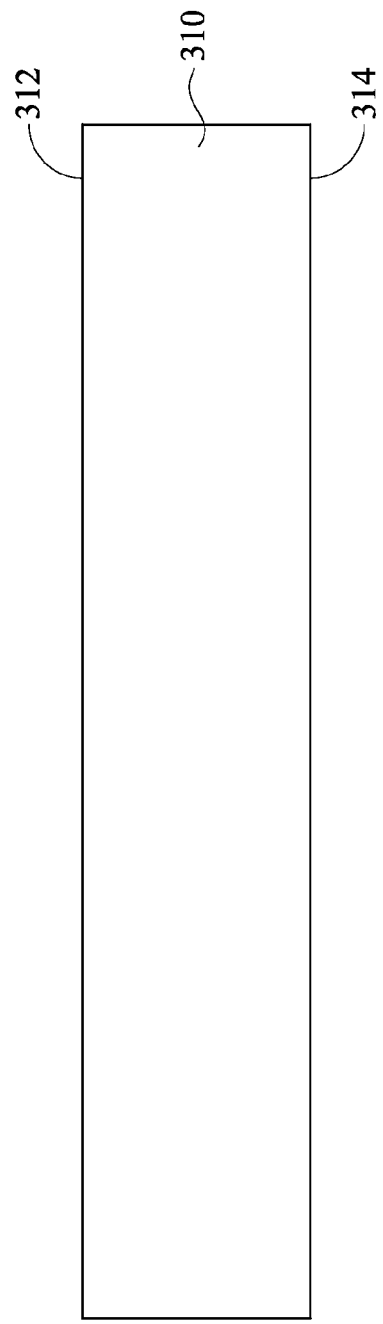

The step S300 of FIG. 3A is to provide a semiconductor substrate 310. The semiconductor substrate 310 can be a silicon substrate, such as a crystallized silicon or amorphous silicon substrate. In this embodiment the semiconductor substrate 310 is a p-type silicon substrate as example. The semiconductor substrate 310 has a light receiving surface 312 and a back surface 314 opposite to the light receiving surface 312. Generally, the light-receiving surface 312 is the top surface of the semiconductor substrate 310 for receiving the sunlight, and the back surface 314 is the bottom surface of the semiconductor substrate 310.

Figure 3B:
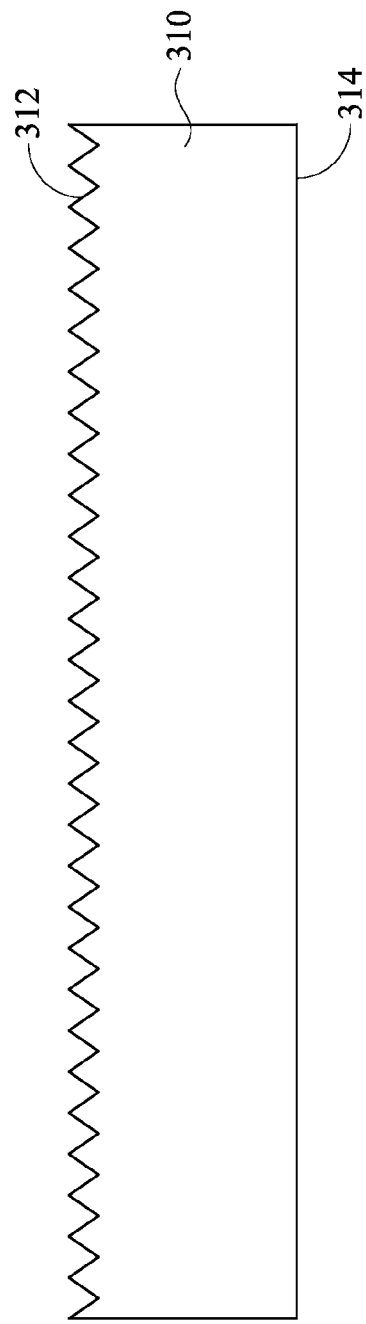

The step S302 of FIG. 3B is to roughen the light-receiving surface 312 of the semiconductor substrate 310 (or wafer). The step S302 to roughen (or namely texturing) the light receiving surface 312 of the semiconductor substrate 310 can be performed by an anisotropic wet etching process, which forms microstructures on the light receiving layer 312. The microstructures may have various shapes and sizes, such as pyramid shapes or other polyhedron. Generally, the quality of the surface roughening process depends on the cleanness of the semiconductor substrate, the concentration and ratio of the etching liquid, the temperature of the etching liquid, and the reaction time. The purpose of roughening the light-receiving surface 312 of the semiconductor substrate 310 is to enhance the utilization of light by preventing the smooth light receiving surface 312 from reflecting the light directly.

Figure 3C:
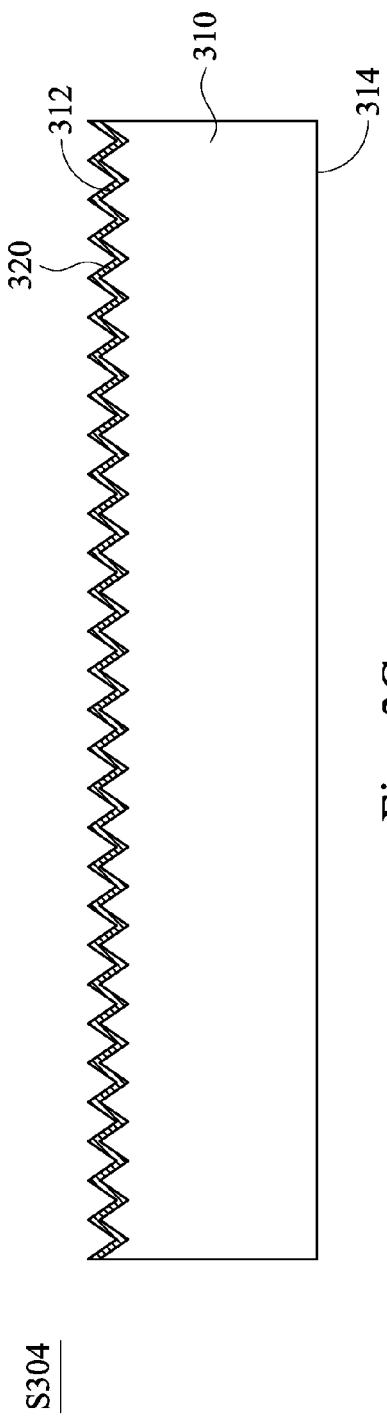

The step S304 of FIG. 3C is to form a barrier layer 320 on the light receiving surface 312 of the semiconductor substrate 310. The materials of the barrier layer 320 can be dielectric materials, such as silicon nitride SiNx. The dielectric materials can also be other suitable materials to form single or multi-layer structure, such as SiON, SiOx, or other materials.

Figure 3D:
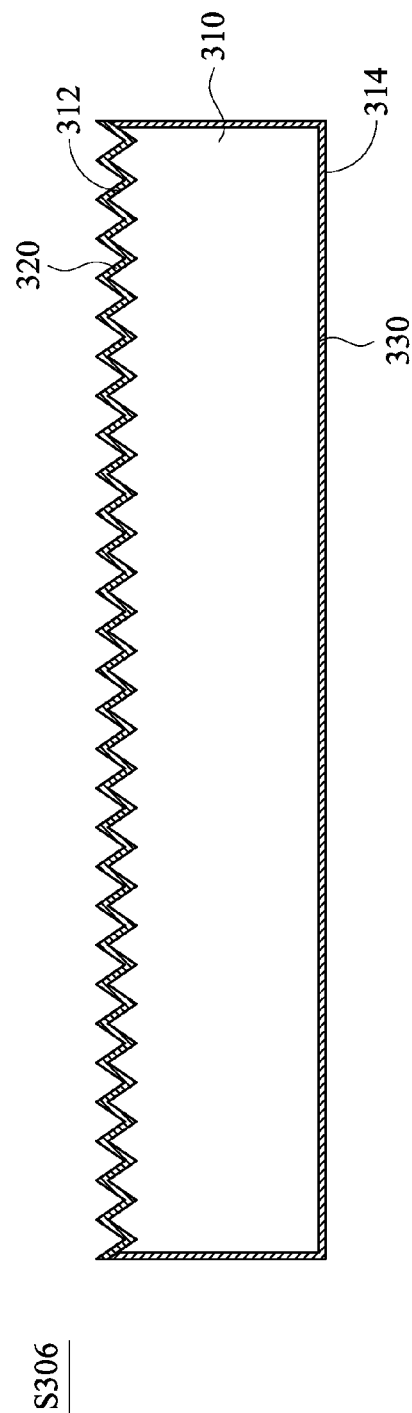

The step S306 of FIG. 3D is to perform a boron ion diffusion process on the semiconductor substrate 310 to form a p-typed doped layer 330 on the side surfaces and the back surface 314 of the semiconductor substrate 310. The barrier layer 320 can isolate the light-receiving surface 312 from the reaction gas and prevent the boron ions from diffusing into the light-receiving surface 312 of the semiconductor substrate 310.

The step to perform boron ion diffusion process on the semiconductor substrate 310 includes the usage of a boron gas. For example, a gas mixture of $BF_3$, oxygen, and nitrogen, diffuses in a high temperature diffusion furnace tube. The diffusion depth of the boron ions diffusion process depends on the concentration of the boron in the gas mixture, the flow rate of the gas mixture, the reaction time and the temperature of the furnace.

The step S308 of FIG. 3E is to cover a protective layer 340 on the p-typed doped layer 330. The protective layer 340 has a predetermined pattern. The protective layer 340 has openings 342 to expose a portion of the p-typed doped layer 330. The locations of the openings 342 is substantially corresponding to the predetermined locations of n-type electrodes on the back surface 314. The materials of the protective layer 340 can be a photo resistant material, wax, or other such materials.

The step S310 of FIG. 3F is to soak the semiconductor substrate 310 in the sour liquid, such as hydrogen fluoride liquid to remove the barrier layer 320 and patterning the p-type doped layer 330.

Patterning the p-type doped layer 330 is to form plural grooves 350 and plural p-type doped zones 332 on the back surface 314, in which the grooves 350 and the p-type doped zones 332 are arranged alternatively. To be specific, a portion of the p-type doped layer 330, which is uncovered by the protective layer 340 and exposed by the openings 342, is removed, which forms grooves 350 on the semiconductor substrate 310. On the other hand, the predetermined region of the grooves 350 are exposed by the opening 342 of the protective layer 340, and the p-type doped layer 330 covered by the protective layer 340 is still hold. As a result, the grooves 350 and the p-type doped zones 332 are arranged alternatively on the back surface 314 of the semiconductor substrate 310. Then, the protective layer 340 is removed.

The step S312 of FIG. 3G is to form the front surface field layer 360 on the light-receiving surface 312, and form the n-type doped zones 362 in the grooves 350.

The front surface field layer (or n-type doped layer) 360 and the n-type doped zones 362 can be formed on the light-receiving surface 312 of the semiconductor substrate 310 and in the grooves 350 of the semiconductor substrate 310 respectively by the process of ion implantation or diffusion for finely controlling the location, distribution, and/or depth of the doped zones. If ion implantation is taken as an example, this step includes the high-energy implantation of an agent containing phosphorous ions, such as $PH_3$, into the predetermined doped zones to form the n-type doped zones 362. After ion implantation, the original structure of the silicon crystal near the surface may be crushed and/or damaged by the high-energy ions. Therefore, an annealing process can be performed after the ion implantation to restore the original structure of the silicon crystal and to activate the dopants. Since the n-type doped zones 362 are disposed inside the grooves 350, p-type doped zones 332 are spaced and disconnected from the n-type doped zones 362.

The step S314 of FIG. 3H is to form a front anti-reflection layer 370 on the front surface field layer 360, and to form a back anti-reflection layer 380 on the back surface 314. That is, the back anti-reflection layer 380 is formed on the p-type doped zones 332 and the n-type doped zones 362 disposed inside the grooves 350.

The front anti-reflection layer 370 and the back anti-reflection layer 380 can be dielectric layers. In one embodiment, the front anti-reflection layer 370 and the back anti-reflection layer 380 can be formed simultaneously or respectively, and the formation step can be performed by plasma enhanced chemical vapor deposition, PECVD. Herein, the reaction gas can be a mixture of silane ($SiH_4$) and ammonia ($NH_3$) or a mixture of silane ($SiH_4$) and nitrogen ($N_2$), so that the front anti-reflection layer 370 with SiNx can be formed on the front surface field layer 360, and that the back anti-reflection layer 380 with SiNx can be formed on the back surface 314. In other embodiments, other dielectric layers with anti-reflection functions can also be adopted, such as SiON, SiOx or other suitable materials, for constructing a single layer or multi-layer structure.

In the fabrication process of PECVD, the composition and the thickness of the anti-reflection layer depends on several factors, such as the frequency and power of the radio frequency signal (RF), the arrangement and pitch of the electrodes of radiofrequency cavity, the reaction time, the temperature and the total pressure during the reaction, and the flow rate and composition of the reaction gas.

The step S316 of FIG. 3I is to form plural conductive pastes 390 on the back surface 314 of the semiconductor substrate 310. That is, the conductive pastes 390 are formed on the back anti-reflection layer 380. The conductive pastes 390 are formed by imprinting, inkjet coating, or other suitable methods. The conductive pastes 390 are disposed corresponding to the n-type doped zones 362 and the p-type doped zones 332 thereby being regarded as n-type electrodes and p-type electrodes. The conductive pastes 390 can be lead-containing silver pastes, aluminum pastes, or silver aluminum pastes.

The step S316 includes curing the conductive pastes 390 for positioning and shaping the conductive pastes 390 on the back surface 314 corresponding to the n-type doped zones 362 and the p-type doped zones 332. The step of curing the conductive pastes 390 can be performed by heating the semiconductor substrate 310.

The step S318 of FIG. 3J is to sinter the conductive pastes 390 to form plural electrodes on the back surface 314 of the semiconductor substrate 310. In the high temperature baking of the semiconductor substrate 310, the conductive material of the conductive pastes 390, such as lead, forms lead glass with the silicon of the back anti-reflection layer 380, in which the lead glass pass through the back anti-reflection layer 380. Therefore, a portion of the conductive pastes 390 connects to and contacts the n-type doped zones 362 thereby being regarded as n-type electrodes; another portion of the conductive pastes 390 connects to and contact the p-type doped zones 332 thereby being regarded as p-type electrodes. Also, in the high temperature baking of the semiconductor substrate 310, the conductive material of the conductive pastes 390 enters the semiconductor substrate 310 and form the p-type doped zones (or namely p+ doped zones) 332 and the n-type doped zones (or namely n+ doped zones) 362 with the silicon of the semiconductor substrate 310, in which the p-type doped zones 332 and the n-type doped zones 362 are formed of the alloy of conductive material and silicon. The p-type electrodes formed from a portion of conductive pastes 390 connect to and contact the p-type doped zones 332. The n-type electrodes formed from another portion of conductive pastes 390 connect to and contact the n-type doped zones 362. Herein, the doping concentration of the p-type doped zones is substantially higher than that of the semiconductor substrate. The doping concentration of the n-type doped zones is substantially higher than that of the n-type doped layer.

After the above step, the n-type electrodes and p-type electrodes can be formed and arranged alternatively on the back surface 314 of the semiconductor substrates 310. The n-type doped zones 362 are spaced and disconnected from the p-type doped zones 332.

Reference is made to FIG. 4A to FIG. 4K, and FIG. 4A to FIG. 4K are different states of a method for fabricating a back-contact type solar cell according to another embodiment of this invention. A method for fabricating a back-contact type solar cell is provided in this embodiment, and the method consists essentially of following steps. Herein the words "consists essentially of following steps," indicates that in addition to the following steps, some regular fabrication steps, such as moving or cleaning, are included in the method provided in the embodiments of the present invention.

The step S400 of FIG. 4A is to provide a semiconductor substrate 410. The semiconductor substrate 410 can be a silicon substrate, such as a crystallized silicon or amorphous silicon substrate. In this embodiment the semiconductor substrate 410 is a p-type silicon substrate as example. The semiconductor substrate 410 has a light receiving surface 412 and a back surface 414 opposite to the light receiving surface 412. Generally, the light receiving surface 412 is the top surface (or namely front surface) of the semiconductor substrate 410 for receiving the sun light, and the back surface 414 is the bottom surface (or namely rear surface) of the semiconductor substrate 410.

The step S402 of FIG. 4B is to roughen the light receiving surface 412 of the semiconductor substrate 410 (or wafer).

The step S402 to roughen (or namely texturing) the light receiving surface 412 of the semiconductor substrate 410 can be performed by an anisotropic wet etching process, which forms microstructures on the light receiving layer 412. The microstructures may have various shapes and sizes, such as pyramid shapes or other polyhedron. Generally, the quality of the surface roughening process depends on the cleanliness of the semiconductor substrate, the concentration and ratio of the etching liquid, the temperature of the etching liquid, and the reaction time. The purpose of roughening the light receiving surface 412 of the semiconductor substrate 410 is to enhance the utilization of light by preventing the smooth light receiving surface 412 from reflecting the light directly.

Figure 4C:
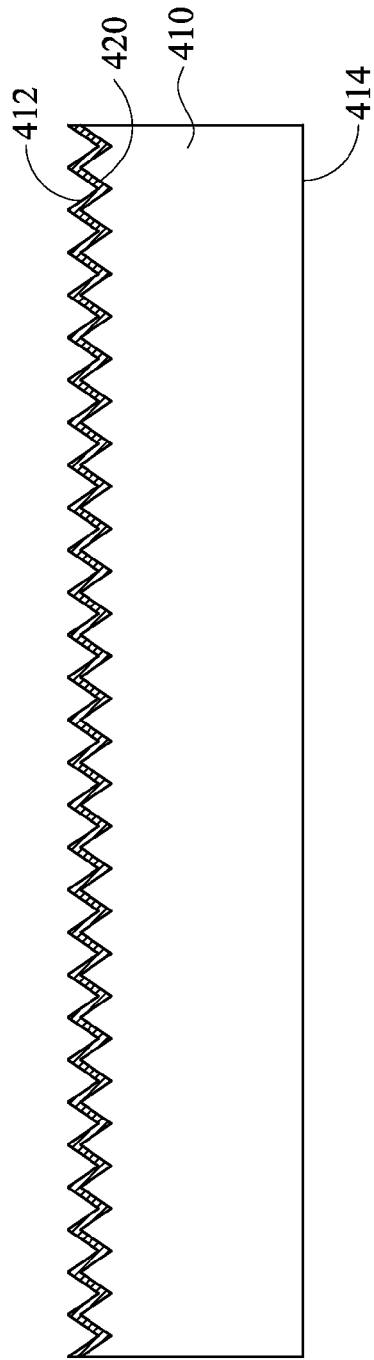

The step S404 of FIG. 4C is to form a front surface field layer (or n-type doped layer) 420 on the light receiving surface 412 of the semiconductor substrate 410. The step S404 is better performed by adopting an ion implantation or diffusion process, so that the front surface field layer 420 are distributed only on the light receiving surface 412 of the semiconductor substrate 410, and the the depths of the front surface field layer 420 are finely controlled. Similarly, after the ion implantation, an annealing process can be performed to restore the single crystal structure and activate the dopants.

Figure 4D:
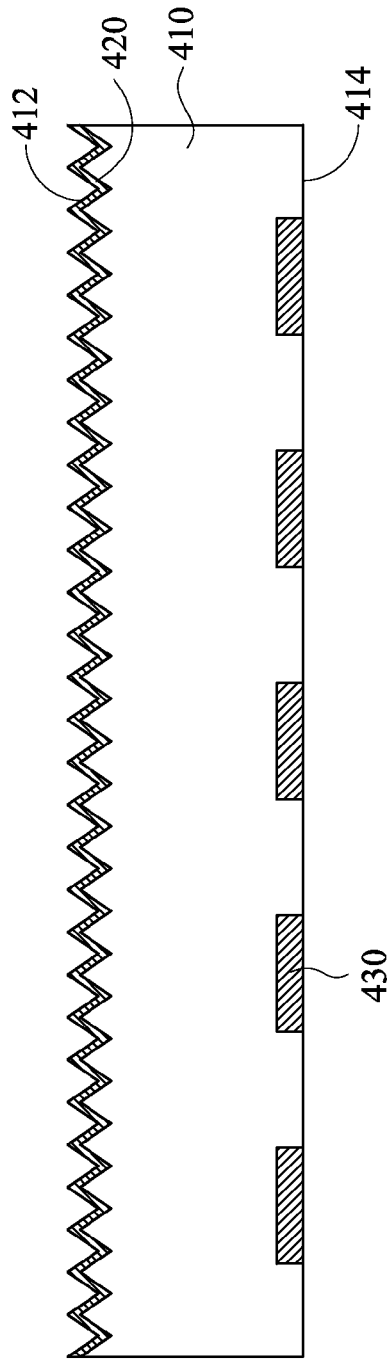

The step S406 of FIG. 4D is to form plural n-type doped zones 430 into the back surface 414 of the semiconductor substrate 410. The step S406 is better performed by adopting an ion implantation or diffusion process for finely controlling the depth and the location of the n-type doped zones 430. Similarly, after the ion implantation, an annealing process can be performed to restore the original structure of the silicon crystal and activate the dopants. In other embodiments, the n-type doped zones 430 can be formed on the back surface 414 first, and the front surface field layer 420 can be formed on the light receiving surface 412 later. As shown in the cross-sectional view of FIG. 4D, one side surface of the semiconductor substrate 410 connects an edge of the light receiving surface 412 and an edge of the back surface 414 of the semiconductor substrate 210. Another side surface of the semiconductor substrate 210 connects another edge of the light receiving surface 412 and another edge of the back surface 414 of the semiconductor substrate 410.

The step S408 of FIG. 4E is to form a barrier layer 440 on the front surface field layer 420, in which the n-type doped zones 430 are optionally covered by the barrier layer 440. In detail, the barrier layer 440 is wholly formed on and covers the front surface field layer 420. When the barrier layer 440 is formed on the back surface 414, the barrier layer 440 has an opening to expose the back surface 414 where the n-type doped zones 430 are not formed on. The materials of the barrier layer 440 can be dielectric materials, such as silicon nitride SiNx. The dielectric materials can also be other suitable materials to form single or multi-layer structure, such as SiON, SiOx, or other materials.

The step S410 of FIG. 4F is to perform a boron ions diffusion process on the semiconductor substrate 410 to form plural p-typed doped zones 450 in the semiconductor substrate 410 uncovered by the barrier layer 440, such as the side surfaces and the back surface 414 of the semiconductor substrate 410 where the n-type doped zones 430 are not formed in. The step to perform a boron ion diffusion process on the semiconductor substrate 410 includes the usage of boron gas. For example, a gas mixture of $BF_3$, oxygen, and nitrogen, diffuses in a high temperature diffusion furnace tube. The diffusion depth of the boron ion diffusion process depends on the concentration of the boron in the gas mixture, the flow rate of the gas mixture, the reaction time and the temperature of the furnace.

Instead of the previous embodiments, the p-type doped zones 450 are formed through the diffusion process in this embodiment. As a result, there is no clear boundary between the p-type doped zones 450 and the n-type doped zones 430 prepared previously. That is, the p-type doped zones 450 may connect to the n-type doped zones 430 directly. The step S410 includes an annealing process on the semiconductor substrate 410 for reducing the leakage of electricity, in which the leakage of electricity is caused by the boron on the surface of the semiconductor substrate 410.

Figure 4G:
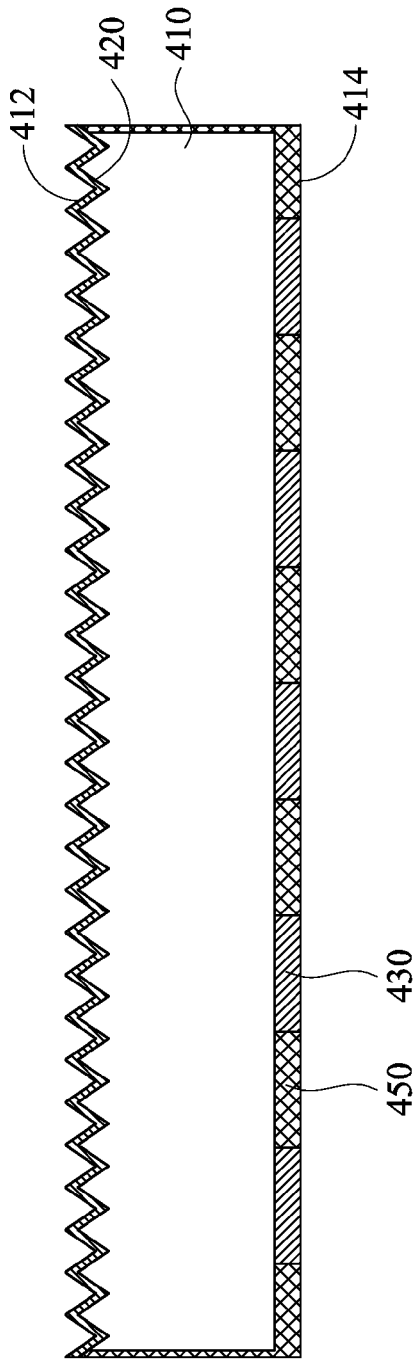

The step S412 of FIG. 4G is to remove the barrier layer 440. For example, the semiconductor substrate 410 is soaked in an acidic liquid, such as hydrogen fluoride liquid, and the depth of the acidic liquid should be higher than the light-receiving surface 412 or high enough to immerse the light-receiving surface 412.

Figure 4H:
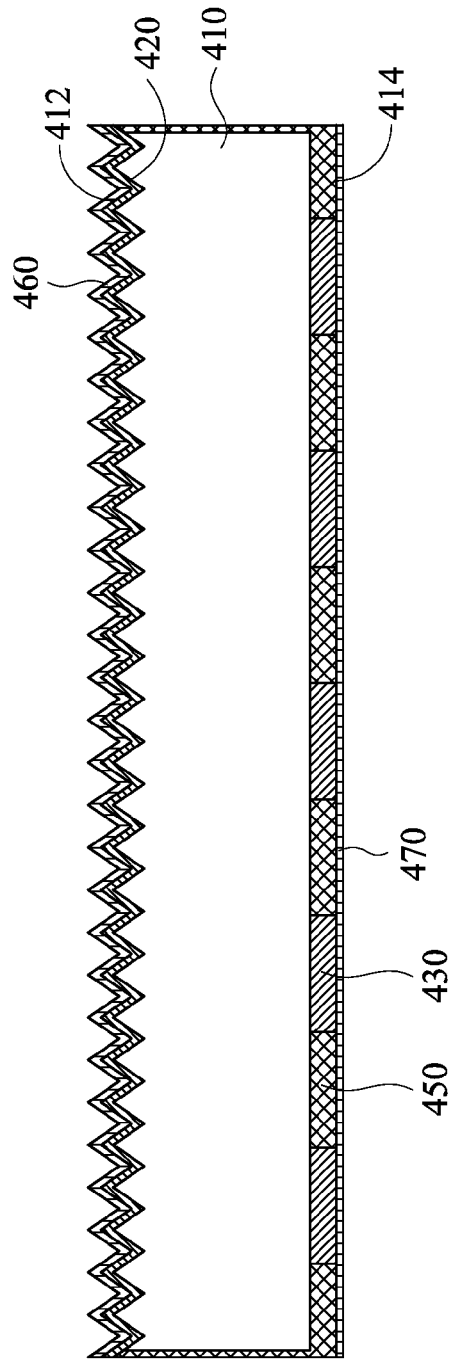

The step S414 of FIG. 4H is to form a front anti-reflection layer 460 on the front surface field layer 420 and to form a back anti-reflection layer 470 on the back surface 414.

The front anti-reflection layer 460 and the back anti-reflection layer 470 can be dielectric layers. In one embodiment, the front anti-reflection layer 460 and the back anti-reflection layer 470 can be formed simultaneously or respectively. Also, the forming step described above can be conducted by plasma enhanced chemical vapor deposition (PECVD). Herein, the reaction gas can be a mixture of silane ($SiH_4$) and ammonia ($NH_3$) or a mixture of silane ($SiH_4$) and nitrogen ($N_2$), so that the front anti-reflection layer 460 with SiNx can be formed on the front surface field layer 420, and that the back anti-reflection layer 470 with SiNx can be formed on the back surface 414, in which the back anti-reflection layer 470 with SiNx can be formed on the n-type doped zones 430 and the p-type doped zones 450 of the back surface 414. In other embodiments, other dielectric layer with anti-reflection functions can also be adopted, such as SiON, SiOx or other suitable materials, for constructing a single layer or multi-layer structure.

In the fabrication process of PECVD, the composition and the thickness of the anti-reflection layer depends on the frequency and power of the radio frequency signal (RF), the arrangement and pitch of the electrodes of radiofrequency cavity, the reaction time, the temperature and the total pressure during the reaction, and the flow rate and composition of the reaction gas.

Figure 4I:
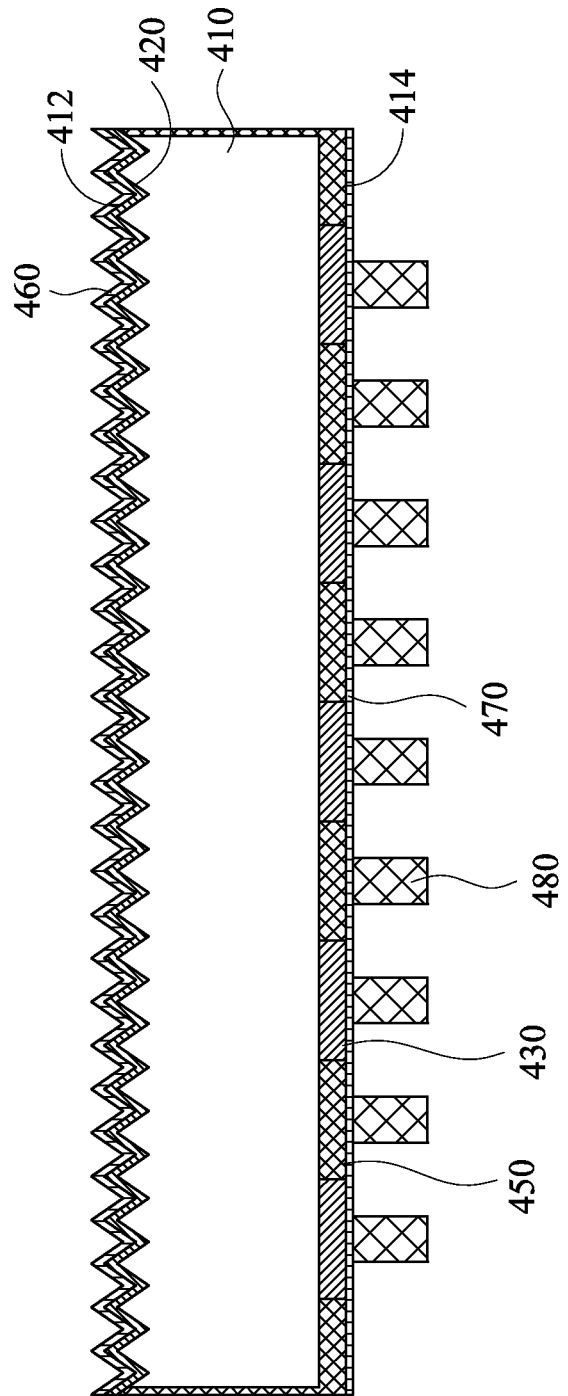

The step S416 of FIG. 4I is to form plural conductive pastes 480 on the back surface 414 of the semiconductor substrate 410. That is, the conductive pastes 480 are formed on the back anti-reflection layer 470. The conductive pastes 480 are formed by imprinting, inkjet coating, or other suitable methods. The conductive pastes 480 are disposed corresponding to the n-type doped zones 430 and the p-type doped zones 450 thereby being regarded as n-type electrodes and p-type electrodes, respectively.

The step S416 includes curing the conductive pastes 480 for positioning and shaping the conductive pastes 480 on the back surface 414 corresponding to the n-type doped zones 430 and the p-type doped zones 450. The step to cure the conductive pastes 480 can be performed by heating the semiconductor substrate 410.

Figure 4J:
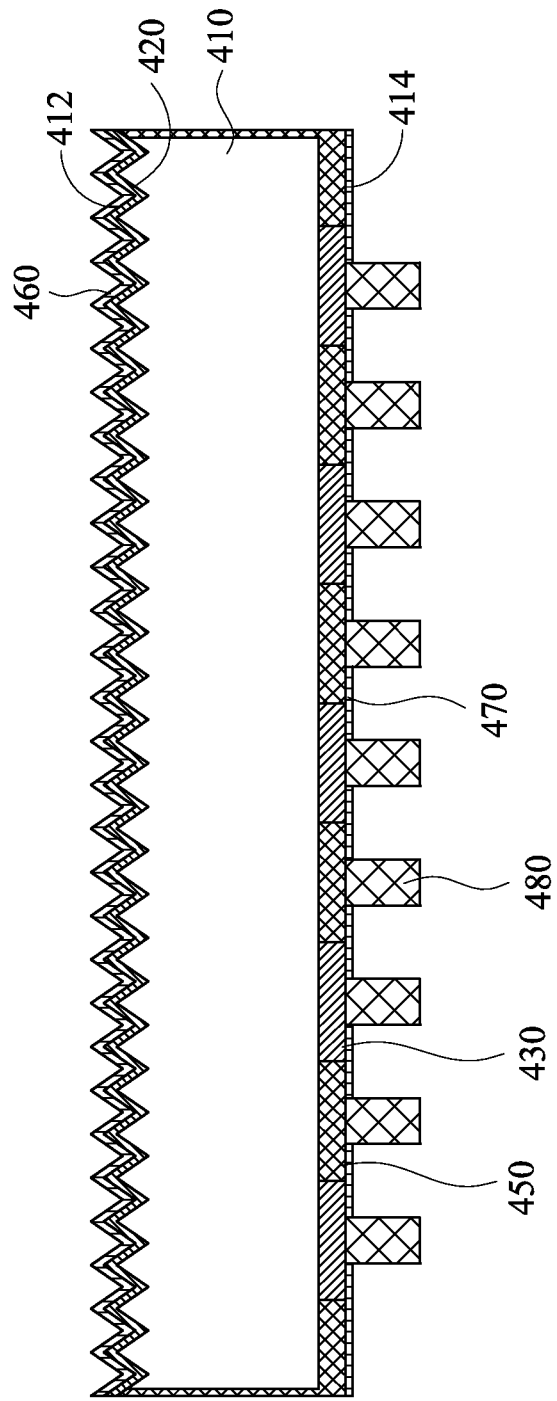

The step S418 of FIG. 4J is to sinter the conductive pastes 480 to form plural electrodes on the back surface 414 of the semiconductor substrate 410. In the high temperature baking of the semiconductor substrate 410, the conductive material of the conductive pastes 480, such as lead, forms lead glass with the silicon of the back anti-reflection layer 470, in which the lead glass pass through the back anti-reflection layer 470. Therefore, a portion of the conductive pastes 480 connects to and contacts the n-type doped zones 430 thereby being regarded as n-type electrodes; another portion of the conductive pastes 480 connects to and contacts the p-type doped zones 450 thereby being regarded as p-type electrodes. Also, in the high temperature baking of the semiconductor substrate 410, the conductive material of the conductive pastes 480 enters the semiconductor substrate 410 and forms the alloy of the conductive material and the silicon with the silicon of the semiconductor substrate 410, which transform the p-type doped zones into p-type heavily doped zones (or namely p+ doped zones) 450 and transform the n-type doped zones into n-type heavily doped zones (or namely n+ doped zones) 430. The p-type electrodes formed from the conductive pastes 480 connect to and contact the p-type heavily doped zones 450. The n-type electrodes formed from the conductive pastes 480 connect to and contact the n-type heavily doped zones 430. Herein, the doping concentration of the p-type heavily doped zones is substantially higher than that of the semiconductor substrate. The doping concentration of the n-type heavily doped zones is substantially higher than that of the n-type doped layer.

Figure 4K:
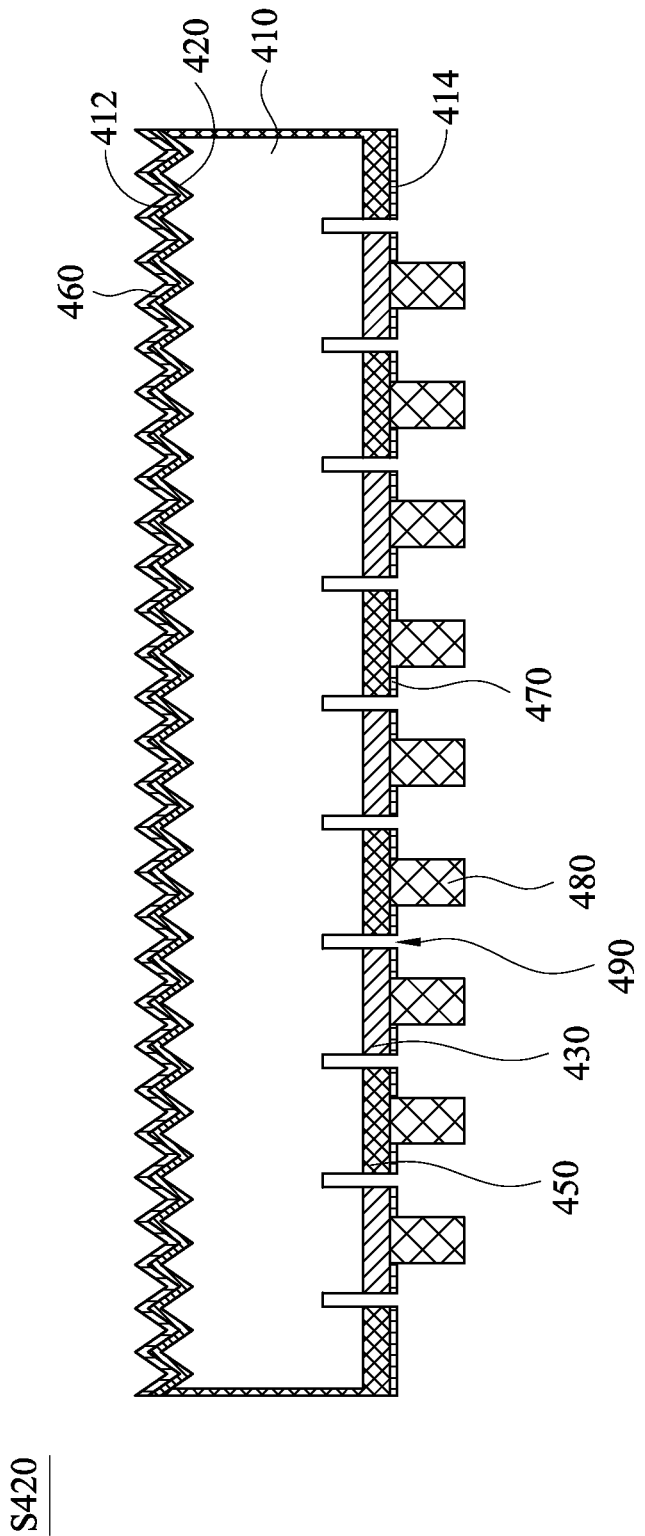

The step S420 of FIG. 4K is to form plural grooves 490 on the back surface 414 of the semiconductor substrate 410 for spacing the n-type doped zones 430 and the p-type doped zones 450 apart. In other words, the n-type doped zones 430 and the adjoining p-type doped zones 450 are spaced by the grooves 490. Herein, the grooves 490 are formed on the border of the n-type doped zones 430 and the adjoining p-type doped zones 450. That is, there are no doped zones or semiconductor material in the grooves 490. The grooves 490 can be fabricated through laser cutting the semiconductor substrate 410.

After the above step, the n-type electrodes and p-type electrodes can be formed and arranged alternatively on the back surface 414 of the semiconductor substrates 410. The n-type doped zones 430 are spaced and disconnected from the p-type doped zones 450.

According to the above embodiment, the production efficiency of back-contact type solar cells can be enhanced effectively by reducing the use of masks and fabrication steps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating a back-contact type solar cell, the method consisting essentially of following steps:
   (a) providing a semiconductor substrate;
   (b) roughening a light-receiving surface of the semiconductor substrate;
   (c) forming a plurality of phosphorus-containing pastes on a back surface of the semiconductor substrate;
   (d) performing a phosphorus diffusion process on the semiconductor substrate, wherein the phosphorus-containing pastes enter the semiconductor substrate to form a plurality of n-type heavily doped zones in the a back surface of the semiconductor substrate, and the phosphorus of the phosphorus diffusion process are diffused into the light-receiving surface of the semiconductor substrate to form a front surface field layer in the light receiving surface of the semiconductor substrate and to form a n-type lightly doped layer in the back surface and a plurality of side surfaces of the semiconductor substrate;
   (e) removing the n-type lightly doped layer;
   (f) forming a front anti-reflection layer on the front surface field layer, and a back anti-reflection layer on the back surface;
   (g) printing a plurality of lead-containing silver pastes on the back anti-reflection layer, wherein the lead-containing silver pastes are disposed corresponding to the n-type heavily doped zones, respectively;
   (h) printing a plurality of lead-containing aluminum pastes on the back anti-reflection layer, wherein the lead-containing aluminum pastes are disposed corresponding to a plurality of p-typed contacting regions of the back-contact type solar cell; and
   (i) sintering the lead-containing silver pastes and the lead-containing aluminum pastes for forming a plurality of electrodes.

2. The method for fabricating a back-contact type solar cell of claim 1, wherein the step (b) comprises performing a wet etching process on the semiconductor substrate.

3. The method for fabricating a back-contact type solar cell of claim 1, wherein the step (e) comprises soaking the semiconductor substrate in a hydrogen fluoride solution to remove a phosphosilicate glass on the semiconductor substrate.

4. The method for fabricating a back-contact type solar cell of claim 1, wherein the front anti-reflection layer and the back anti-reflection layer in the step (f) are dielectric layers.

5. The method for fabricating a back-contact type solar cell of claim 1, wherein the step (g) comprises curing the lead-containing silver pastes.

6. The method for fabricating a back-contact type solar cell of claim 1, wherein the step (h) comprises curing the lead-containing aluminum pastes.

7. The method for fabricating a back-contact type solar cell of claim 1, wherein the step (i) comprises:
   making the lead-containing silver pastes pass through the back anti-reflection layer, and contact the n-type heavily doped zones.

8. The method for fabricating a back-contact type solar cell of claim 1, wherein the step (i) comprises:
   making the lead-containing aluminum pastes pass through the back anti-reflection layer, and the aluminum of the lead-containing aluminum pastes enters the semiconductor substrate to forms a plurality of p-type heavily doped zones, and the lead-containing aluminum pastes connect to the p-type heavily doped zones, respectively, wherein the n-type heavily doped zones are spaced from the p-type heavily doped zones, and the n-type heavily doped zones and the p-type heavily doped zones are alternately arranged.

9. A method for fabricating a back-contact type solar cell, the method consisting essentially of following steps:
   (a) providing a semiconductor substrate;
   (b) roughening a light receiving surface of the semiconductor substrate;
   (c) performing a phosphorus diffusion process on the semiconductor substrate, wherein the phosphorus of the phosphorus diffusion process are diffused into the semiconductor substrate to form a front surface field layer in the light receiving surface of the semiconductor substrate and a n-type doped layer in the back surface and a plurality of side surfaces of the semiconductor substrate;
   (d) removing the n-type doped layer;
   (e) forming a plurality of n-type doped zones in a back surface of the semiconductor substrate;
   (f) forming a plurality of p-type doped zones in the back surface of the semiconductor substrate, wherein the n-type doped zones are spaced from the p-type doped zones;

(g) forming a front anti-reflection layer on the front surface field layer, and a back anti-reflection layer on the back surface;

(h) printing a plurality of conductive pastes on the back anti-reflection layer, wherein the conductive pastes are disposed corresponding to the n-type doped zones and the p-type doped zones, respectively; and (i) sintering the conductive pastes for forming a plurality of electrodes.

10. The method for fabricating a back-contact type solar cell of claim 9, wherein the step (b) comprises performing a wet etching process on the semiconductor substrate.

11. The method for fabricating a back-contact type solar cell of claim 9, wherein the step (d) comprises soaking the semiconductor substrate in a hydrogen fluoride solution to remove a phosphosilicate glass on the semiconductor substrate.

12. The method for fabricating a back-contact type solar cell of claim 9, wherein the step (e) is performed through ion implantation.

13. The method for fabricating a back-contact type solar cell of claim 9, wherein the step (f) is performed through ion implantation.

14. The method for fabricating a back-contact type solar cell of claim 9, wherein the front anti-reflection layer and the back anti-reflection layer in the step (g) are dielectric layers.

15. The method for fabricating a back-contact type solar cell of claim 9, wherein the step (i) comprises:
making the conductive pastes pass through the back anti-reflection layer, and contact the n-type doped zones and the p-type doped zones respectively.

16. A method for fabricating a back-contact type solar cell, the method consisting essentially of following steps:
(a) providing a semiconductor substrate;
(b) roughening a light receiving surface of the semiconductor substrate;
(c) forming a mask layer on the light receiving surface;
(d) performing a boron ions diffusion process on the semiconductor substrate to form a p-type doped layer in the back surface and a plurality of side surfaces of the semiconductor substrate;
(e) removing the mask layer;
(f) patterning the p-type doped layer to form a plurality of grooves and a plurality of p-type doped zones in the back surface, wherein the grooves and the p-type doped zones are alternately arranged;
(g) forming a front surface field layer on the light receiving surface, and a plurality of n-type doped zones in the grooves, wherein the n-type doped zones are spaced from the p-type doped zones;
(h) forming a front anti-reflection layer on the front surface field layer, and a back anti-reflection layer on the back surface;
(i) printing a plurality of conductive pastes on the back anti-reflection layer, wherein the conductive pastes are disposed corresponding to the n-type doped zones and the p-type doped zones, respectively; and
(j) sintering the conductive pastes for forming a plurality of electrodes.

17. The method for fabricating a back-contact type solar cell of claim 16, wherein the step (b) comprises performing a wet etching process on the semiconductor substrate.

18. The method for fabricating a back-contact type solar cell of claim 16, wherein the mask layer in the step (c) comprises a material of silicon nitrides.

19. The method for fabricating a back-contact type solar cell of claim 16, wherein the step (e) comprises soaking the semiconductor substrate in a hydrogen fluoride solution to remove the mask layer.

20. The method for fabricating a back-contact type solar cell of claim 16, wherein the step (f) comprises:
partially disposing a protective layer on the p-type doped layer and exposing a plurality of predetermined regions of the grooves; and
etching the p-type doped layer and the semiconductor substrate.

21. The method for fabricating a back-contact type solar cell of claim 16, wherein the step (g) is performed through ion implantation or a diffusion process.

22. The method for fabricating a back-contact type solar cell of claim 16, wherein the front anti-reflection layer and the back anti-reflection layer in the step (h) are dielectric layers.

23. The method for fabricating a back-contact type solar cell of claim 16, wherein the step (j) comprises:
making the conductive pastes pass through the back anti-reflection layer, and contact the n-type doped zones and the p-type doped zones, respectively.

24. A method for fabricating a back-contact type solar cell, the method consisting essentially of following steps:
(a) providing a semiconductor substrate;
(b) roughening a light receiving surface of the semiconductor substrate;
(c) forming a front surface field layer in the light-receiving surface;
(d) forming a plurality of n-type doped zones in the back surface of the semiconductor substrate;
(e) forming a mask layer on the front surface field layer and covering the n-type doped zones;
(f) performing a boron ion doping process on the semiconductor substrate to form a plurality of p-type doped zones in the semiconductor substrate where the mask layer uncovers;
(g) annealing the semiconductor substrate;
(h) removing the mask layer;
(i) forming a front anti-reflection layer on the front surface field layer, and a back anti-reflection layer on the back surface;
(j) printing a plurality of conductive pastes on the back anti-reflection layer, wherein the conductive pastes are disposed corresponding to the n-type doped zones and the p-type doped zones, respectively;
(k) sintering the conductive pastes for forming a plurality of electrodes; and
(l) forming a plurality of grooves on the back surface for isolating the n-type doped zones from the p-type doped zones.

25. The method for fabricating a back-contact type solar cell of claim 24, wherein the step (b) comprises performing a wet etching process on the semiconductor substrate.

26. The method for fabricating a back-contact type solar cell of claim 24, wherein the step (c) is performed through ion implantation or a diffusion process.

27. The method for fabricating a back-contact type solar cell of claim 24, wherein the step (d) is performed through ion implantation or a diffusion process.

28. The method for fabricating a back-contact type solar cell of claim 24, wherein the mask layer in the step (e) comprises a material of silicon nitrides.

29. The method for fabricating a back-contact type solar cell of claim 24, wherein the step (h) comprises soaking the semiconductor substrate in a hydrogen fluoride solution.

30. The method for fabricating a back-contact type solar cell of claim 24, wherein the front anti-reflection layer and the back anti-reflection layer in the step (i) are dielectric layers.

31. The method for fabricating a back-contact type solar cell of claim 24, wherein the step (k) comprises:
   making the conductive pastes pass through the back anti-reflection layer, and contact the n-type doped zones and the p-type doped zones respectively.

32. The method for fabricating a back-contact type solar cell of claim 24, wherein the grooves in the step (l) are formed by laser cutting the semiconductor substrate.

* * * * *